(12) United States Patent
Seong et al.

(10) Patent No.: US 10,714,618 B2
(45) Date of Patent: Jul. 14, 2020

(54) FINFET WITH VARIOUS SHAPED SOURCE/DRAIN REGIONS

(71) Applicant: Samsung Electronics Co., Ltd., Suwon-si, Gyeonggi-do (KR)

(72) Inventors: Geum-jung Seong, Seoul (KR); Bo-ra Lim, Seoul (KR); Jeong-yun Lee, Hwaseong-si (KR); Ah-reum Ji, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 12 days.

(21) Appl. No.: 16/129,935

(22) Filed: Sep. 13, 2018

(65) Prior Publication Data
US 2019/0245076 A1 Aug. 8, 2019

(30) Foreign Application Priority Data
Feb. 6, 2018 (KR) ........................ 10-2018-0014717

(51) Int. Cl.
| | | |
|---|---|---|
| *H01L 29/78* | (2006.01) | |
| *H01L 29/06* | (2006.01) | |
| *H01L 29/08* | (2006.01) | |
| *H01L 27/088* | (2006.01) | |
| *H01L 21/768* | (2006.01) | |
| *H01L 21/8238* | (2006.01) | |
| *H01L 29/66* | (2006.01) | |
| *H01L 27/092* | (2006.01) | |

(52) U.S. Cl.
CPC ...... *H01L 29/785* (2013.01); *H01L 21/76829* (2013.01); *H01L 21/823821* (2013.01); *H01L 27/0886* (2013.01); *H01L 27/0924* (2013.01); *H01L 29/0649* (2013.01); *H01L 29/0657* (2013.01); *H01L 29/0847* (2013.01); *H01L 29/66553* (2013.01); *H01L 29/7854* (2013.01)

(58) Field of Classification Search
CPC .............. H01L 29/785; H01L 29/7854; H01L 29/0649; H01L 29/66553; H01L 29/0847; H01L 29/0657; H01L 27/0924; H01L 27/0886; H01L 21/823821; H01L 21/76829
See application file for complete search history.

(56) References Cited

U.S. PATENT DOCUMENTS

| | | |
|---|---|---|
| 9,123,744 B1 | 9/2015 | Liao et al. |
| 9,159,630 B1 | 10/2015 | Wei et al. |
| 9,318,581 B1 | 4/2016 | Guo et al. |
| 9,349,649 B2 | 5/2016 | Chan et al. |

(Continued)

FOREIGN PATENT DOCUMENTS

KR   10-2016-0122475 A   10/2016

*Primary Examiner* — Allen L Parker
*Assistant Examiner* — Gustavo G Ramallo
(74) *Attorney, Agent, or Firm* — Harness, Dickey & Pierce, P.L.C.

(57) ABSTRACT

A semiconductor device includes a substrate having a fin active region pattern having a protruding shape, a device isolation layer pattern covering a side surface of a lower portion of the fin active region pattern, a spacer pattern covering a side surface of a portion of the fin active region pattern that protrudes from a top surface of the device isolation layer pattern, and a source/drain region in contact with a top surface of the fin active region pattern and a top surface of the spacer pattern.

18 Claims, 23 Drawing Sheets

(56) References Cited

U.S. PATENT DOCUMENTS

| | | |
|---|---|---|
| 9,601,575 B2 | 3/2017 | Jung et al. |
| 9,837,405 B1 * | 12/2017 | Cheng ................. H01L 27/0886 |
| 2005/0236694 A1 * | 10/2005 | Wu ................... H01L 21/02126 |
| | | 257/632 |
| 2008/0099834 A1 * | 5/2008 | Willer ............. H01L 21/823431 |
| | | 257/330 |
| 2014/0117418 A1 * | 5/2014 | Flachowsky .......... H01L 29/785 |
| | | 257/288 |
| 2015/0318399 A1 * | 11/2015 | Jeong ................. H01L 29/7853 |
| | | 257/401 |
| 2016/0197182 A1 | 7/2016 | Li |
| 2016/0307927 A1 | 10/2016 | Lee et al. |
| 2016/0315172 A1 | 10/2016 | Wu et al. |
| 2017/0062584 A1 | 3/2017 | Basker et al. |
| 2017/0207126 A1 * | 7/2017 | Ching ................. H01L 29/7848 |
| 2017/0263722 A1 * | 9/2017 | You ................... H01L 29/41791 |
| 2018/0097000 A1 * | 4/2018 | Bi ....................... H01L 27/0886 |

\* cited by examiner

US 10,714,618 B2

FINFET WITH VARIOUS SHAPED SOURCE/DRAIN REGIONS

CROSS-REFERENCE TO RELATED APPLICATION

This application claims the benefit of Korean Patent Application No. 10-2018-0014717, filed on Feb. 6, 2018, in the Korean Intellectual Property Office, the disclosure of which is incorporated herein in its entirety by reference.

BACKGROUND

The inventive concepts relate to a semiconductor device, and more particularly, to a semiconductor device having source/drain regions.

With the development of electronic technology, semiconductor devices configured to operate at a higher speed have been required. In recent years, the downscaling of semiconductor devices has rapidly proceeded to obtain higher operating speeds of the semiconductor devices. With a sharp reduction in the design rule of semiconductor devices, electrical failures have increased during manufacturing processes.

SUMMARY

The inventive concepts provide a semiconductor device having source/drain regions, which may reduce or prevent occurrence of electrical failures and ensure required operating characteristics.

According to an aspect of the
s, there is provided a semiconductor device including a substrate having a fin active region pattern having a protruding shape, a device isolation layer pattern covering a side surface of a lower portion of the fin active region pattern, a spacer pattern covering a side surface of a portion of the fin active region pattern, which protrudes from a top surface of the device isolation layer pattern, and a source/drain region in contact with a top surface of the fin active region pattern and a top surface of the spacer pattern.

According to another aspect of the inventive concepts, there is provided a semiconductor device including a substrate having a first fin active region pattern and a second fin active region pattern, each of which has a protruding shape, a device isolation layer pattern covering a side surface of a lower portion of each of the first fin active region pattern and the second fin active region pattern, a first source/drain region in contact with the first fin active region pattern, the first source/drain region including a first lower side unit and a first upper side unit on the first lower side unit, and a second source/drain region in contact with a top surface of the second fin active region pattern, the second source/drain region including a second lower side unit and a second upper side unit on the second lower side unit. Each of the first lower side unit and the second lower side unit has a constant lateral width or a lateral width reducing away from the substrate in a vertical direction, and the lateral width of the first lower side unit is greater than the lateral width of the second lower side unit.

According to another aspect of the inventive concepts, there is provided a semiconductor device including a substrate having a first fin active region pattern and a second fin active region pattern formed in a first region and a second region, respectively, wherein the first fin active region pattern and the second fin active region pattern are doped with impurities of different conductivity types, a device isolation layer pattern covering side surfaces of lower portions of the first fin active region pattern and the second fin active region pattern, respectively, a spacer pattern covering a side surface of a portion of the first fin active region pattern protruding from a top surface of the device isolation layer pattern and a side surface of a portion of the second fin active region pattern, a first source/drain region including a first lower side unit in contact with a top surface of the first fin active region pattern and a top surface of the spacer pattern and a first upper side unit on the first lower side unit, and a second source/drain region including a second lower side unit in contact with a top surface of the second fin active region pattern and the top surface of the spacer pattern and a second upper side unit on the second lower side unit. Each of the first lower side unit and the second lower side unit has a lateral width reducing away from the substrate in a vertical direction.

BRIEF DESCRIPTION OF THE DRAWINGS

Example embodiments of the inventive concepts will be more clearly understood from the following detailed description taken in conjunction with the accompanying drawings in which:

FIGS. 3A, 3B, and 3C are diagrams of a semiconductor device according to an example embodiment, wherein FIG. 3A is a cross-sectional view taken along a line A-A' of FIG. 2A, according to an example embodiment, FIG. 3B is a cross-sectional view taken along a line B-B' of FIG. 2A, according to an example embodiment, FIG. 3C is a cross-sectional view taken along a line C-C' of FIG. 2A, according to an example embodiment;

FIGS. 4A to 4D are diagrams of a semiconductor device according to an example embodiment, wherein FIG. 4A is an enlarged cross-sectional view of a region IV of FIG. 3A, according to an example embodiment, and FIGS. 4B to 4D are enlarged cross-sectional views of the region IV of FIG. 3A, according to other example embodiments;

FIGS. 5A to 5F are cross-sectional views of process operations of a method of manufacturing a semiconductor device according to an example embodiment, wherein FIGS. 5A to 5F are cross-sectional views of main components of portions corresponding to the cross-sectional view taken along the line A-A' of FIG. 2A;

FIGS. 7A and 7B are diagrams of a semiconductor device according to an example embodiment, wherein FIG. 7A is a cross-sectional view taken along a line VII-VII' of FIG. 6, according to an example embodiment, and FIG. 7B is a cross-sectional view of a portion corresponding to the cross-sectional view taken along the line VII-VII' of FIG. 6, according to another example embodiment;

FIGS. 8A to 8F are cross-sectional views of process operations of a method of manufacturing a semiconductor device, according to an example embodiment, wherein FIGS. 8A to 8F are cross-sectional views of main components of portions corresponding to the cross-sectional view taken along the line VII-VII' of FIG. 6.

DETAILED DESCRIPTION OF EXAMPLE EMBODIMENTS

Figure 1:
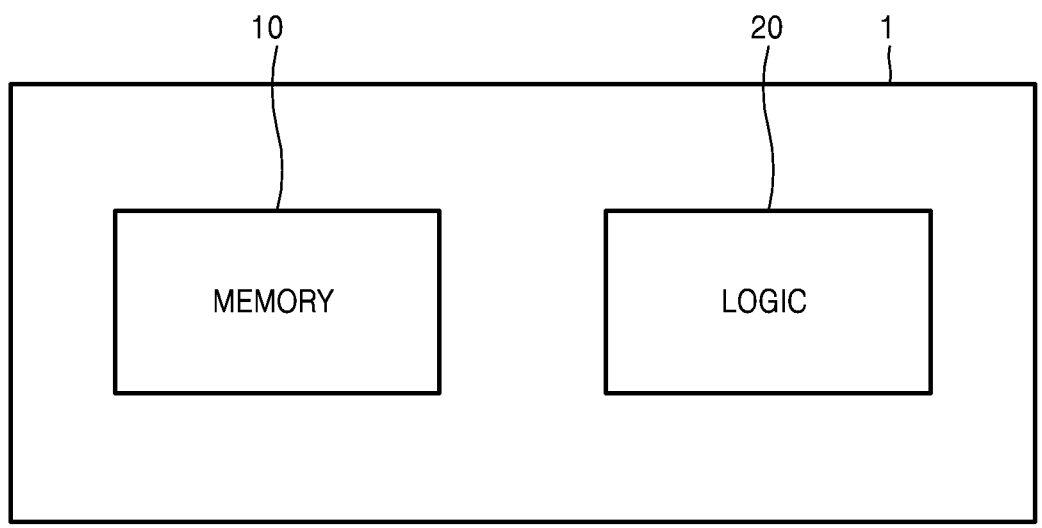
FIG. 1 is a block diagram of a semiconductor device according to an example embodiment.

FIG. 1 is a block diagram of a semiconductor device 1 according to an embodiment.

Referring to FIG. 1, the semiconductor device 1 may include a memory region 10 and/or a logic region 20.

The memory region 10 may include at least one of a static random access memory (SRAM) memory device, a dynamic RAM (DRAM) memory device, a magnetic RAM (MRAM) memory device, a resistive RAM (RRAM) memory device, and a phase-change RAM (PRAM) memory device.

The logic region 20 may include standard cells (e.g., counters and buffers) configured to perform desired logic functions. The standard cells may include various kinds of logic cells including a plurality of circuit elements, such as transistors and registers. The logic cells may constitute, for example, AND, NAND, OR, NOR, exclusive OR (XOR), exclusive NOR (XNOR), inverters (INV), adders (ADD), buffers (BUF), delays (DLY), filters (FIL), multiplexers (MXT/MXIT). OR/AND/INVERTER (OAI), AND/OR (AO), AND/OR/INVERTER (AOI), D-flip-flops, reset flip-flops, master-slave flip-flops, and latches.

Figure 2A:
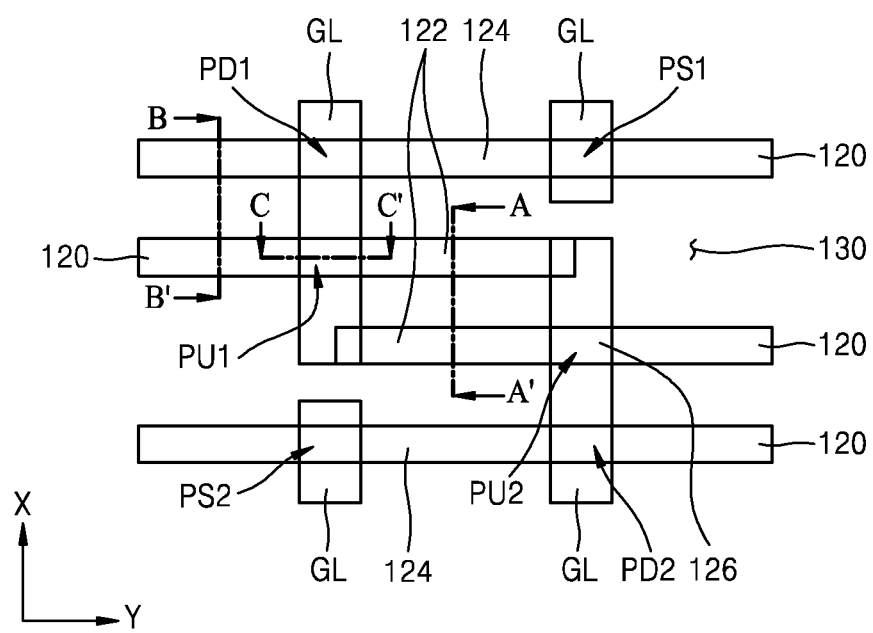
FIG. 2A is a plan view of main components of a memory device, which may be included in a memory region of a semiconductor device, according to an example embodiment.
Figure 2B:
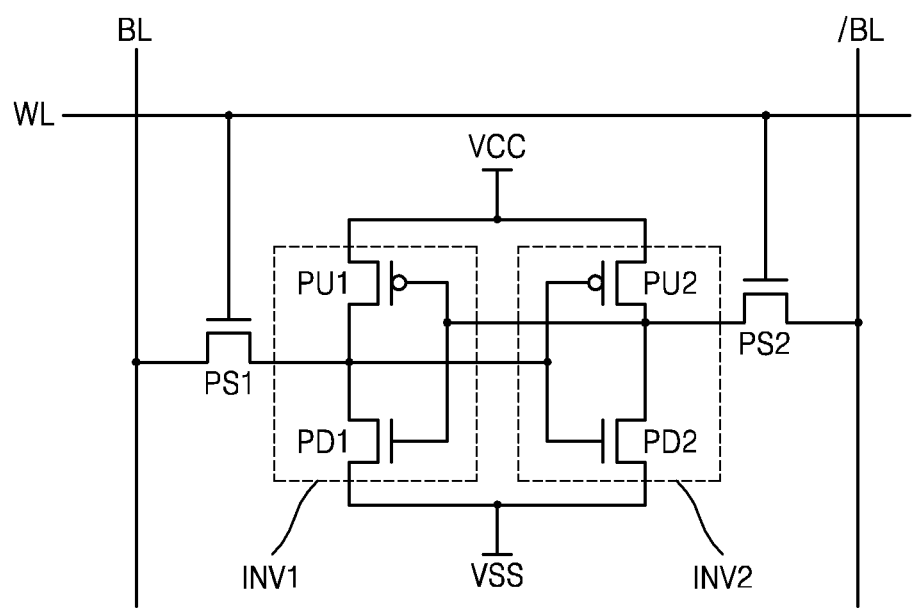
FIG. 2B is an equivalent circuit diagram of the memory device of FIG. 2A, according to an example embodiment.

FIG. 2A is a plan view of main components of a memory device, which may be included in a memory region 10 of a semiconductor device, according to an example embodiment. FIG. 2B is an equivalent circuit diagram of the memory device of FIG. 2A, according to an example embodiment. FIG. 2B is an equivalent circuit diagram of an SRAM memory device region, which is an example of the memory region 10.

Referring to FIG. 2A, the memory region 10 may include a plurality of fin active region patterns 120 having line or bar shapes, which may extend in a second direction (Y direction) and be arranged in a first direction (X direction), and a plurality of gate patterns GL, which may extend in the first direction (X direction) perpendicular to the second direction (Y direction) and be arranged in the second direction (Y direction). The fin active region patterns 120 may be spaced apart from each other in the first direction (X direction), and the gate patterns GL may be spaced apart from each other in the second direction (Y direction).

The fin active region patterns 120 may be surrounded by a device isolation layer pattern 130. The fin active region patterns 120 may include first fin active region patterns 122 and/or second fin active region patterns 124, which may not overlap the gate patterns GL, third fin active region patterns 126, which may overlap the gate patterns GL. Each of the first fin active region patterns 122, the second fin active region patterns 124, and the third fin active region patterns 126 may be a portion of the fin active region patterns 120. For example, each of the fin active region patterns 120 may include at least one first fin active region pattern 122 and at least one third fin active region pattern 126, include at least one second fin active region pattern 124 and at least one third fin active region pattern 126, or include at least one first fin active region pattern 122, at least one second fin active region pattern 124, and at least one third fin active region pattern 126.

The first fin active region pattern 122 and the second fin active region pattern 124 may be formed adjacent to the gate patterns GL. A top surface of the third fin active region pattern 126 may be at a higher level than a top surface of the first fin active region pattern 122 and a top surface of the second fin active region pattern 124.

According to an example embodiment, the first fin active region pattern 122, the second fin active region pattern 124, and the third fin active region pattern 126 may be surrounded by the device isolation layer pattern 130, and the third fin active region pattern 126 may protrude from a top surface of the device isolation layer pattern 130. In some example embodiments, upper portions of the first fin active region pattern 122 and the second fin active region pattern 124 may protrude from the top surface of the device isolation layer pattern 130, and an upper portion of the third fin active region pattern 126 may protrude from the top surface of the device isolation layer pattern 130 over the first fin active region pattern 122 and the second fin active region pattern 124. That is, side surfaces of a lower portion of each of the first fin active region pattern 122, the second fin active region pattern 124, and the third fin active region pattern 126 may be covered by the device isolation layer pattern 130.

For example, the first fin active region pattern 122 and the second fin active region pattern 124 may be regions in which a first source/drain region (refer to 162 in FIGS. 3A and 3B) and a second source/drain region (refer to 164 in FIG. 3B) will be formed respectively, and the third fin active region pattern 126 may be a region in which a channel will be formed.

The first fin active region pattern 122 and the second fin active region pattern 124 may be doped with impurities of different conductivity types. For example, the first fin active region pattern 122 may be doped with N-type impurities, and the second fin active region pattern 124 may be doped with P-type impurities. The third fin active region pattern 126 may be doped with N-type impurities or P-type impurities. For example, a third fin active region pattern 126 located between a pair of first fin active region patterns 122 may be doped with N-type impurities, while a third fin active region pattern 126 located between a pair of second fin active region patterns 124 may be doped with P-type impurities.

The third fin active region patterns 126, portions of the gate patterns GL located on the third fin active region patterns 126, and a pair of first fin active region patterns 122 located on both sides of the portions of the gate patterns GL may constitute pull-up transistors PU1 and PU2. The third fin active region patterns 126, portions of the gate patterns GL located on the third fin active region patterns 126, and a pair of second fin active region patterns 124 located on both sides of the portions of the gate patterns GL may constitute pull-down transistors PD1 and PD2 or pass transistors PS1 and PS2.

The pull-up transistors PU1 and PU2 may include, for example, a first pull-up transistor PU1 and a second pull-up transistor PU2. The pull-down transistors PD1 and PD2 may include, for example, a first pull-down transistor PD1 and a second pull-down transistor PD2. The pass transistors PS1 and PS2 may include, for example, a first pass transistor PS1 and a second pass transistor PS2.

For example, the first pull-up transistor PU1 and the second pull-up transistor PU2 may be PMOS transistors. For example, the first pull-down transistor PD1, the second pull-down transistor PD2, the first pass transistor PS1, and the second pass transistor PS2 may be NMOS transistors.

Referring to FIG. 2B, the SRAM memory device region may include a pair of inverters INV1 and INV2, which are connected in parallel between a power node VCC and a ground node VSS, and a first pass transistor PS1 and a second pass transistor PS2, which are connected to output nodes of the inverters INV1 and INV2. The first pass transistor PS1 and the second pass transistor PS2 may be connected to a bit line BL and a complementary bit line/BL, respectively. Gates of the first pass transistor PS1 and the second pass transistor PS2 may be connected to word lines WL. The first pass transistor PS1 and the second pass transistor PS2 may be NMOS transistors.

A first inverter INV1 may include the first pull-up transistor PU1 and the first pull-down transistor PD1, which are connected in series, while a second inverter INV2 may include the second pull-up transistor PU2 and the second pull-down transistor PD2, which are connected in series. The first pull-up transistor PU1 and the second pull-up transistor PU2 may be PMOS transistors, and the first pull-down transistor PD1 and the second pull-down transistor PD2 may be NMOS transistors.

In addition, an input node of the first inverter INV1 may be connected to an output node of the second inverter INV2, and an input node of the second inverter INV2 may be connected to an output node of the first inverter INV1 so that the first inverter INV1 and the second inverter INV2 may constitute one latch circuit.

For example, a gate of each of the first pull-up transistor PU1, the second pull-up transistor PU2, the first pull-down transistor PD1, the second pull-down transistor PD2, the first pass transistor PS1, and the second pass transistor PS2 and the word lines WL may be portions of the gate patterns (refer to GL in FIG. 2A).

Figure 3A:
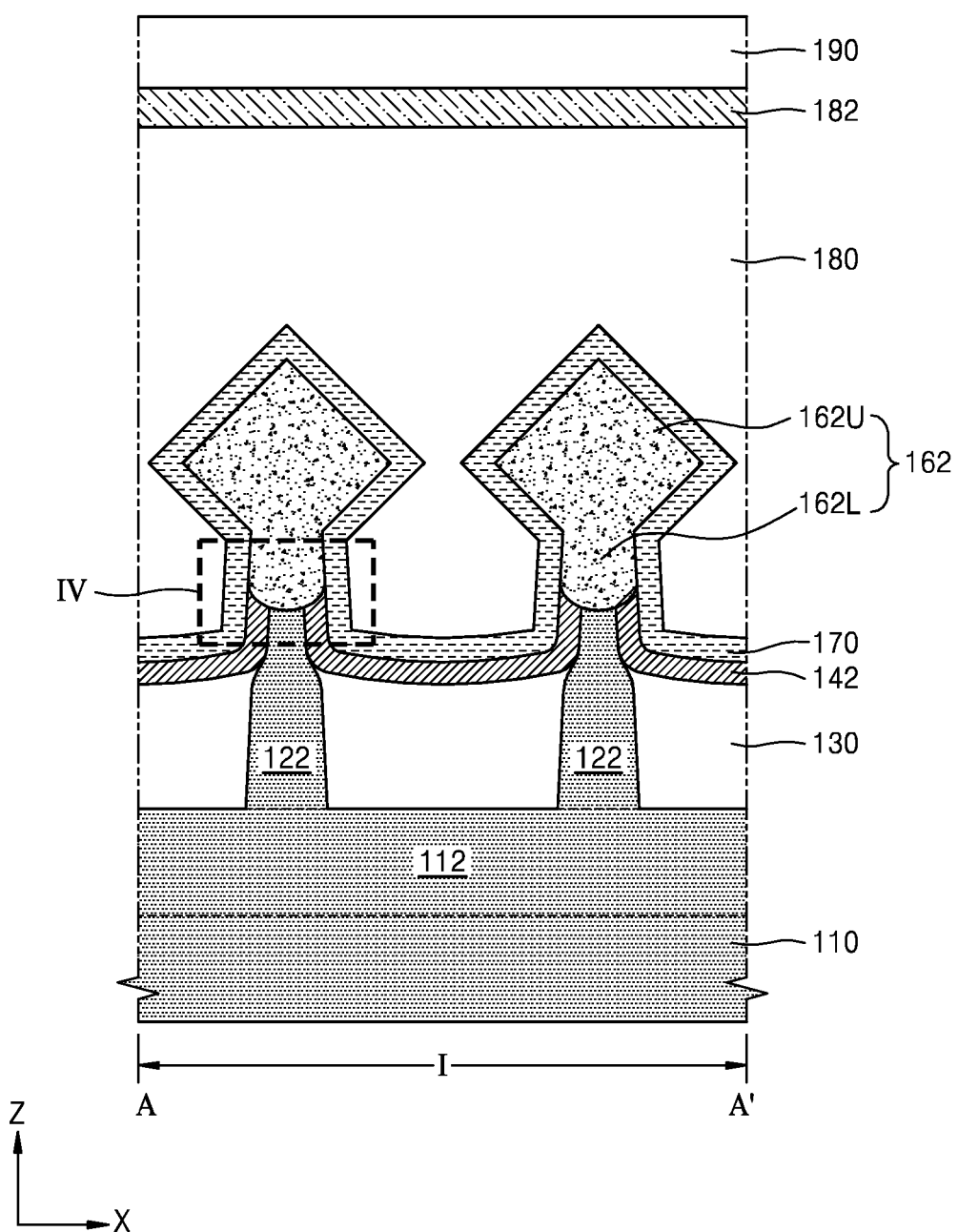
Figure 3B:
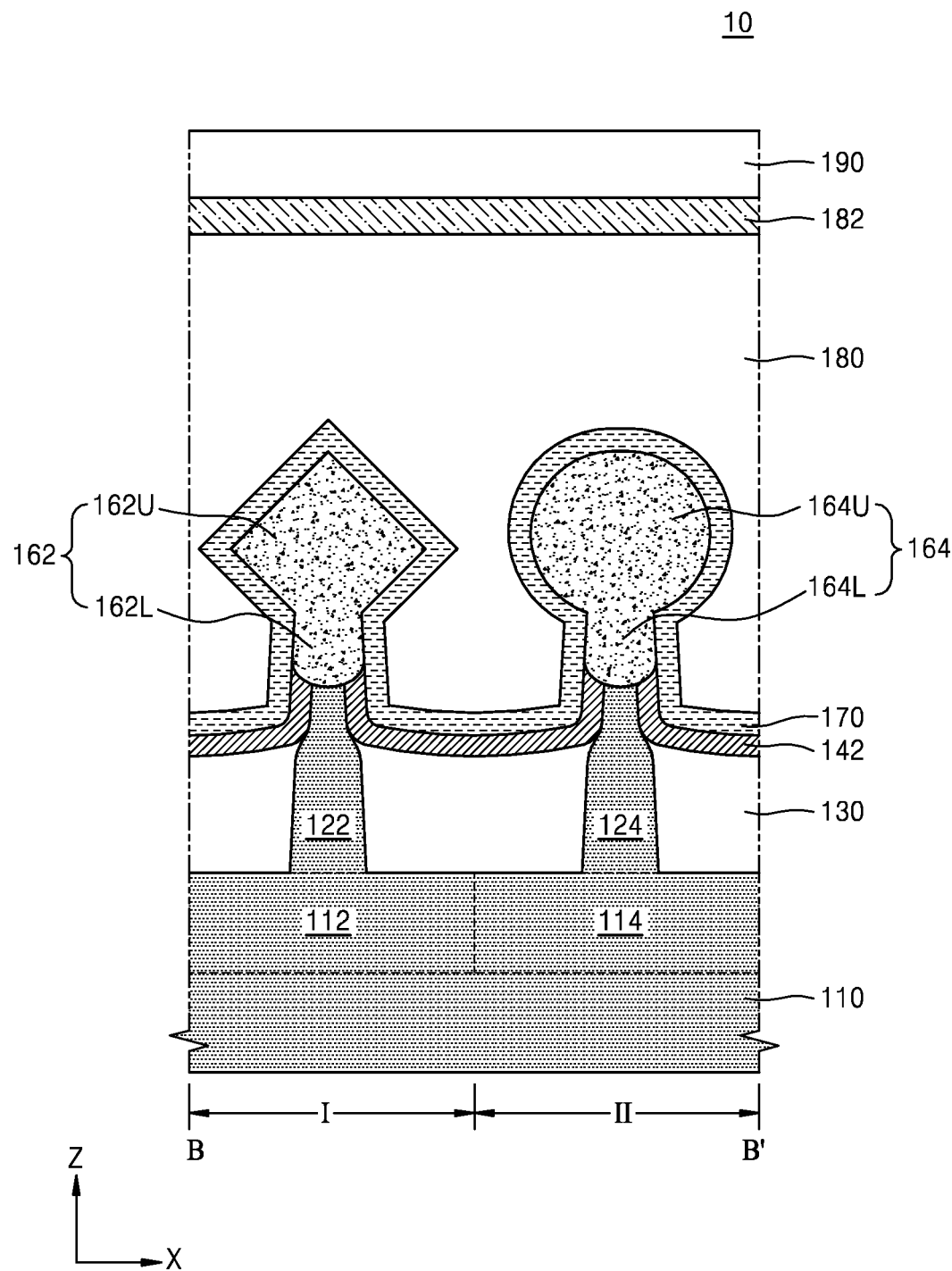
Figure 3C:
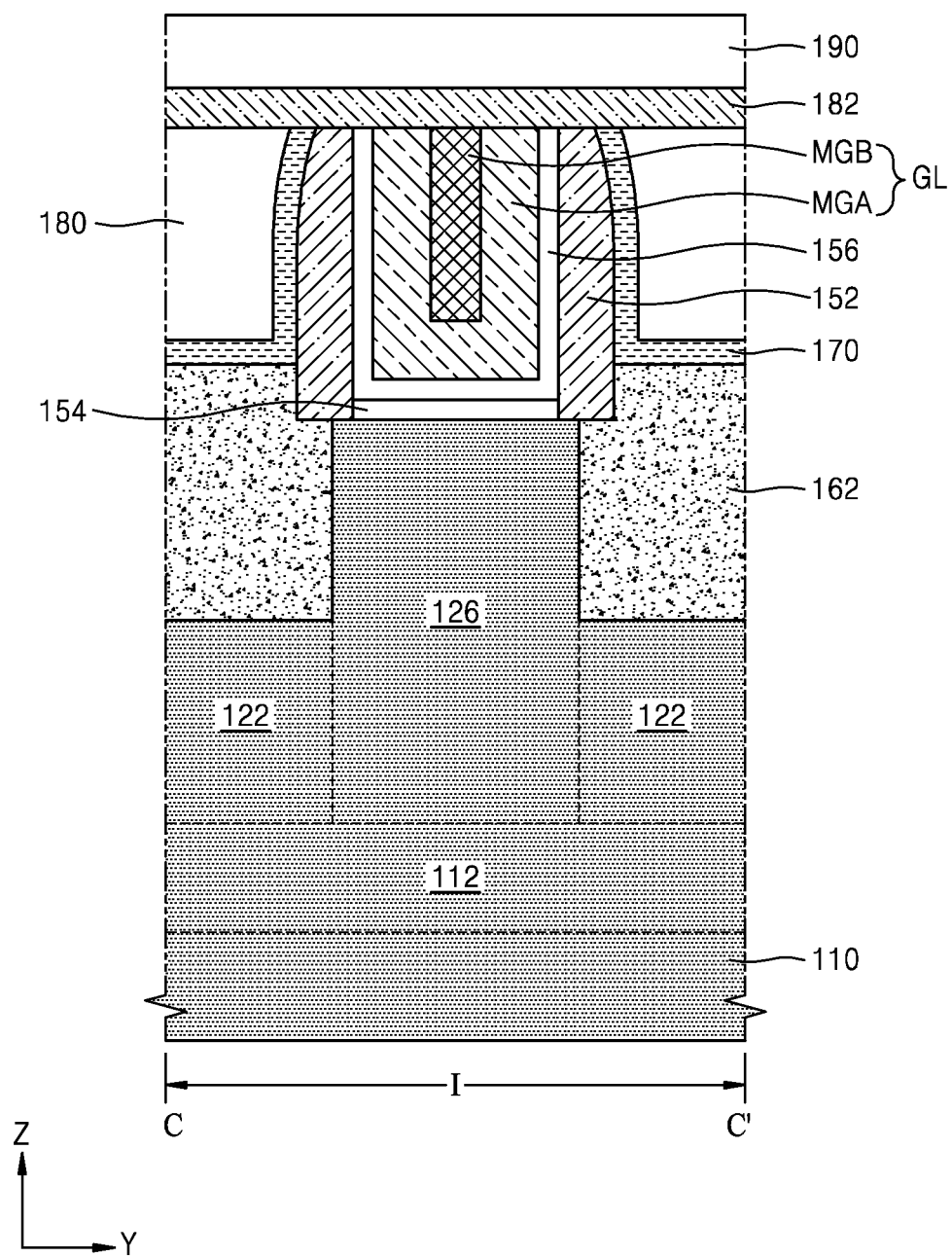

FIGS. 3A, 3B, and 3C are diagrams of a semiconductor device according to an example embodiment. FIG. 3A is a cross-sectional view taken along a line A-A' of FIG. 2A, according to an example embodiment, FIG. 3B is a cross-sectional view taken along a line B-B' of FIG. 2A, according to an example embodiment, and FIG. 3C is a cross-sectional view taken along a line C-C' of FIG. 2A, according to an example embodiment. That is, FIGS. 3A to 3C are cross-sectional views of portions of a memory region of the semiconductor device, according to an example embodiment.

Referring to FIGS. 3A to 3C, a memory region 10 may include a substrate 110 having a first region I and a second region II, a first well region 112 formed in an upper portion of the first region I of the substrate 110, a second well region 114 formed in an upper region of the second region II of the substrate 110, a first fin active region pattern 122 protruding from the first well region 112 in a third direction (Z direction) that is perpendicular to a main surface of the substrate 110 of the first well region 112, and a second fin active region pattern 124 protruding from the second well region 114 in the third direction (Z direction). The memory region 10 may further include a third fin active region pattern 126, which may protrude from the first well region 112 of the substrate 110 in the third direction (Z direction). Although not shown in FIGS. 3A to 3C, the third fin active region pattern 126 may protrude from the second well region 114 of the substrate 110 in the third direction (Z direction).

The substrate 110 may include a semiconductor material. The substrate 110 may include at least one of a Group III-V material and a Group IV material. The substrate 110 may include, for example, silicon (Si). Alternatively, the substrate 110 may include a semiconductor element, such as germanium (Ge), or a compound semiconductor material, such as silicon germanium (SiGe), silicon carbide (SiC), gallium arsenide (GaAs), indium arsenide (InAs), and indium phosphide (InP). The Group III-V material may be a binary, ternary, or quarternary compound including at least one Group III element and at least one Group V element. The Group III-V material may be a compound including at least one Group III element of In, Ga, and Al and at least one Group V element of As, P, and Sb as a Group V element. For example, the Group III-V material may be selected from the group consisting of InP, $In_zGa_{1-z}As$ ($0 \leq z \leq 1$), and $Al_zGa_{1-z}As$ ($0 \leq z \leq 1$). The binary compound may be, for example, any one of InP, GaAs, InAs, InSb, and GaSb. The ternary compound may be any one of InGaP, InGaAs, AlInAs, InGaSb, GaAsSb, and GaAsP. The Group IV material may be silicon (Si) or germanium (Ge). However, the Group III-V material and the Group IV material that may be used for the semiconductor device according to the embodiment are not limited to the above-described examples. The Group III-V material and the Group IV material (e.g., Ge) may be used as channel materials for low-power high-speed transistors. Highly efficient CMOS devices may be formed using a semiconductor substrate including a Group III-V material (e.g., GaAs) having a higher electron mobility than a silicon substrate and a semiconductor substrate including a semiconductor material (e.g., Ge) having a higher hole mobility than the silicon substrate.

In some example embodiments, when an NMOS transistor is formed on the substrate 110, the substrate 110 may include any one of the above-described Group III-V materials. In some other example embodiments, when a PMOS transistor is formed on the substrate 110, at least a portion of the substrate 110 may include Ge. For example, a PMOS transistor may be formed in the first region I, while a PMOS transistor may be formed in the second region II. For example, at least a portion of the first region I of the substrate 110 may include Ge, and the second region II of the substrate 110 may include any one of the above-described Group III-V materials.

In some example embodiments, the substrate 110 may have a silicon-on-insulator (SOI) structure or a germanium-on-insulator (GOI) structure. For example, the substrate 110 may include a buried oxide (BOX) layer. The substrate 110 may include a conductive region, for example, a doped well. The substrate 110 may have various device isolation structures, such as a shallow trench isolation (STI) structure and a deep trench isolation (DTI) structure.

The first well region 112 and the second well region 114 may be doped with impurities of different conductivity types. In some example embodiments, the first well region 112 may be doped with N-type impurities, and the second well region 114 may be doped with P-type impurities.

A first fin active region pattern 122 and a second fin active region pattern 124 may be doped with impurities of different conductivity types. For example, the first fin active region pattern 122 may be doped with N-type impurities, and the second fin active region pattern 124 may be doped with P-type impurities. The third fin active region pattern 126 may be doped with N-type impurities or P-type impurities. For example, a third fin active region pattern 126 located between a pair of first fin active region patterns 122 may be doped with N-type impurities.

Although FIG. 3C illustrates a case in which the third fin active region pattern 126 is located between a pair of first fin active region patterns 122, the inventive concepts are not limited thereto. For example, the third fin active region pattern 126 may be located between a pair of second fin active region patterns 124. In this case, the third fin active region pattern 126 may be doped with P-type impurities.

A top surface of the third fin active region pattern 126 may be higher than a top surface of the first fin active region pattern 122 and a top surface of the second fin active region pattern 124. The first fin active region pattern 122, the second fin active region pattern 124, and the third fin active region pattern 126 may be surrounded by a device isolation layer pattern 130, and the third fin active region pattern 126 may protrude from a top surface of the device isolation layer pattern 130. Upper portions of the first fin active region pattern 122 and the second fin active region pattern 124 may protrude to a relatively small extent from the top surface of the device isolation layer pattern 130. An upper portion of the third fin active region pattern 126 may protrude from the top surface of the device isolation layer pattern 130 over the first fin active region pattern 122 and the second fin active region pattern 124.

The device isolation layer pattern 130 may include a silicon-containing insulating film, such as a silicon oxide film, a silicon nitride film, a silicon oxynitride film, and a silicon carbonitride film, polysilicon (poly-Si), or a combination thereof. The device isolation layer pattern 130 may be formed using a plasma enhanced chemical vapor deposition (PECVD) process, a high-density plasma (HDP) CVD process, an inductively coupled plasma (ICP) CVD process, a capacitor-coupled plasma (CCP) CVD process, a flowable CVD (FCVD) process, and/or a spin coating process, but the inventive concepts are not limited to the above-described methods.

In some example embodiments, the device isolation layer pattern 130 may have a composite structure. For example, a device isolation film may include first and second liners, which are sequentially stacked, and a buried insulating film formed on the second liner. The first liner may include, for example, an oxide such as silicon oxide, and the second liner may include, for example, poly-Si or a nitride such as silicon nitride. The buried insulating film may include, for example, an oxide such as silicon oxide.

A first source/drain region 162 may be located on the first fin active region pattern 122, and a second source/drain region 164 may be located on the second fin active region pattern 124. Also, a gate pattern GL may be located on the third fin active region pattern 126 so that a channel may be formed in the third fin active region pattern 126.

A first spacer pattern 142 may cover side surfaces of respective portions of the first fin active region pattern 122 and the second fin active region pattern 124, which protrude from the top surface of the device isolation layer pattern 130. The first spacer pattern 142 may not cover respective top surfaces of the first fin active region pattern 122 and the second fin active region pattern 124, which protrude from the top surface of the device isolation layer pattern 130. In some example embodiments, the first spacer pattern 142 may cover both the side surfaces of the respective portions of the first fin active region pattern 122 and the second fin active region pattern 124 and the top surface of the device isolation layer pattern 130.

The first spacer pattern 142 may include silicon nitride (SiN), silicon oxynitride (SiON), or carbon-containing silicon oxynitride (SiOCN). In some example embodiments, the first spacer pattern 142 may include carbon-containing silicon oxynitride (SiOCN). The first spacer pattern 142 may be formed using an atomic layer deposition (ALD) process.

The first source/drain region 162 and the second source/drain region 164 may include semiconductor layers, which may be epitaxially grown from the first fin active region pattern 122 and the second fin active region pattern 124, respectively. Portions of bottom surfaces of the first source/drain region 162 and the second source/drain region 164 may be respectively in contact with the top surfaces of the first fin active region pattern 122 and the second fin active region pattern 124, which protrude from the top surface of the device isolation layer pattern 130. Each of the first source/drain region 162 and the second source/drain region 164 may include an embedded SiGe structure including a plurality of epitaxially grown SiGe layers, an epitaxially grown silicon (Si) layer, or an epitaxially grown silicon carbide (SiC) layer.

The first source/drain region 162 and the second source/drain region 164 may be doped with impurities of different conductivity types. For example, the first source/drain region 162 may be doped with P-type impurities, and the second source/drain region 164 may be doped with N-type impurities.

The first source/drain region 162 may include a first lower side unit 162L and a first upper side unit 162U disposed on the first lower side unit 162L. The first lower side unit 162L may be integrally formed with the first upper side unit 162U. The first lower side unit 162L may refer to a lower portion of the first source/drain region 162, which has a relatively small lateral width, while the first upper side unit 162U may refer to an upper portion of the first source/drain region 162, which is located on the first lower side unit 162L and has a relatively large lateral width. The first upper side unit 162U may have a polyhedral shape having facets.

Specifically, the first lower side unit 162L may be a portion of the first source/drain region 162, which may be adjacent to the first fin active region pattern 122 and has a constant lateral width or a lateral width reducing away from the substrate 110 in a third direction (Z direction), which is a vertical direction. The first upper side unit 162U may have a lateral width, which may increase and then decrease away from the first lower side unit 162L in the third direction (Z direction). Accordingly, an upper portion of the first upper side unit 162U may have a smaller lateral width than the first lower side unit 162L. An interface between the first upper side unit 162U and the first lower side unit 162L may be a point at which a lateral width of the first source/drain region 162 starts to increase away from the substrate 110 in the third direction (Z direction).

The lateral width of the first lower side unit 162L may be greater than a lateral width of a top surface of a portion of the first fin active region pattern 122, which protrudes from the top surface of the device isolation layer pattern 130. The lateral width of the first lower side unit 162L may be greater than a lateral width of the portion of the first fin active region pattern 122, which protrudes from the device isolation layer pattern 130 in the third direction (Z direction). A bottom surface of the first lower side unit 162L may be in contact with the first fin active region pattern 122 and the first spacer pattern 142. A lateral width of a portion of the first lower side unit 162L, which is in contact with the first fin active region pattern 122 and the first spacer pattern 142, may be equal or similar to the sum of the lateral width of the portion of the first fin active region pattern 122 in contact with the first lower side unit 162L and a lateral width of a portion of the first spacer pattern 142 in contact with the first lower side unit 162L.

The second source/drain region 164 may include a second lower side unit 164L and a second upper side unit 164U located on the second lower side unit 164L. The second lower side unit 164L may be integrally formed with the second upper side unit 164U. The second lower side unit 164L may refer to a lower portion of the second source/drain region 164, which has a relatively small lateral width, while the second upper side unit 164U may refer to an upper portion of the second source/drain region 164, which is located on the second lower side unit 164L and has a relatively great lateral width. The second upper side unit 164U may have a near-spherical shape. For example, at least a portion of the surface of the second upper side unit 164U may have a round shape. In some example embodiments, the second upper side unit 164U may have a near-spherical shape of which a portion has a facet. In some example embodiments, the second upper side unit 164U may have a near-ellipsoidal shape having a vertical height greater than a lateral width thereof. In some example embodiments, the second upper side unit 164U may have partially flat side surfaces or have partially flat side surfaces and top surface.

Specifically, the second lower side unit 164L may be a portion of the second source/drain region 164, which is adjacent to the second fin active region pattern 124 and has a constant lateral width or a lateral width reducing away from the substrate 110 in the third direction (Z direction). The second upper side unit 164U may have a lateral width, which may increase and then decrease away from the second lower side unit 164L in the third direction (Z direction). Accordingly, an upper portion of the second upper side unit 164U may have a smaller lateral width than the second lower side unit 164L. An interface between the second upper side unit 164U and the second lower side unit 164L may be a point at which a lateral width of the second source/drain region 164 starts to increase away from the substrate 110 in the third direction (Z direction).

The lateral width of the second lower side unit 164L may be greater than a lateral width of a top surface of a portion of the second fin active region pattern 124, which protrudes from the top surface of the device isolation layer pattern 130. The lateral width of the second lower side unit 164L may be greater than the lateral width of the portion of the second fin active region pattern 124, which protrudes from the device isolation layer pattern 130 in the third direction (Z direction). A bottom surface of the second lower side unit 164L may be in contact with the second fin active region pattern 124 and the first spacer pattern 142. A lateral width of a portion of the second lower side unit 164L in contact with the second fin active region pattern 124 and the first spacer pattern 142 may be equal or similar to the sum of a lateral width of the second fin active region pattern 124 in contact with the second lower side unit 164L and a lateral width of the first spacer pattern 142 in contact with the second lower side unit 164L.

The gate pattern GL may be located on the third fin active region pattern 126. Gate spacer patterns 152 may be located on both sides of the gate pattern GL. An interfacial insulating layer pattern 154 may be located between the third fin active region pattern 126 and the gate pattern GL. A gate insulating layer pattern 156 may extend from a space between the interfacial insulating layer pattern 154 and the gate pattern GL along a space between the gate spacer pattern 152 and the gate pattern GL.

Although FIG. 3C illustrates a case in which an uppermost end of the gate insulating layer pattern 156 is at the same level as an uppermost end of the gate pattern GL, the inventive concepts are not limited thereto. For example, the gate insulating layer pattern 156 may extend only to a level lower than the uppermost end of the gate pattern GL from the space between the interfacial insulating layer pattern 154 and the gate pattern GL along the space between the gate spacer pattern 152 and the gate pattern GL.

Although FIG. 3C illustrates a case in which an uppermost end of the gate spacer pattern 152 is at the same level as the uppermost end of the gate pattern GL, the inventive concepts are not limited thereto. For example, the uppermost end of the gate pattern GL may be at a lower level than the uppermost end of the gate spacer pattern 152. In this case, a gate capping layer may be located on the gate pattern GL. The gate capping layer may include at least one of silicon oxide, silicon nitride, and silicon oxynitride.

The gate spacer pattern 152 may include SiN, SiOCN, SiCN, or a combination thereof. The interfacial insulating layer pattern 154 may be formed by oxidizing an upper portion of the third fin active region pattern 126. The gate insulating layer pattern 156 may include a silicon oxide film, a high-k dielectric film, or a combination thereof. The high-k dielectric film may include a material having a higher dielectric constant than the silicon oxide film. The gate insulating layer pattern 156 may have a dielectric constant of about 10 to about 25. The gate insulating layer pattern 156 may include hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, and lead zinc niobate, or a combination thereof, but the inventive concepts are not limited thereto.

The gate pattern GL may include a first metal-containing layer MGA and a second metal-containing layer MGB. The first metal-containing layer MGA may control a work function. The second metal-containing layer MGB may fill a space formed in an upper portion of the first metal-containing layer MGA. The first metal-containing layer MGA may include a conductive material having a work function of less than about 4.5 eV. The first metal-containing layer MGA may include, for example, an aluminum (Al)-containing alloy, an Al-containing conductive metal carbide, an Al-containing conductive metal nitride, or a combination thereof. In some example embodiments, the first metal-containing layer MGA may include TiAl, TiAlC, TiAlN, or a combination thereof. The first metal-containing layer MGA may include a single layer or a multilayered structure.

The second metal-containing layer MGB may include an upper work-function control film, a conductive barrier film, a gap-fill metal film, or a combination thereof. The upper work-function control film may include a conductive material having a work function of about 4.5 eV or more. The upper work-function control film may include, for example, titanium nitride (TiN), tantalum nitride (TaN), tungsten (W), tungsten carbonitride (WCN), or a combination thereof. The conductive barrier film may include a metal nitride, for example, TiN, TaN, or a combination thereof. The gap-fill metal film may include tungsten (W). At least one of the upper work-function control film, the conductive barrier film, and the gap-fill metal film may be omitted.

A first etch stop film 170 may cover the first source/drain region 162, the second source/drain region 164, and the first spacer pattern 142. The first etch stop film 170 may include, for example, a nitride. The first etch stop film 170 may surround side surfaces of the first lower side unit 162L and the portion of the first fin active region pattern 122, which protrudes from the top surface of the device isolation layer pattern 130. The side surfaces of the first lower side unit 162L may be in contact with the first etch stop film 170, and a bottom surface of first lower side unit 162L may be in contact with each of the first fin active region pattern 122 and the first spacer pattern 142. The first spacer pattern 142 may not be in contact with the side surfaces of the first lower side unit 162L. Accordingly, an uppermost end of the first spacer pattern 142 may be at a lower level than a lowermost end of the first upper side unit 162U.

Similarly, the first etch stop film 170 may surround side surfaces of the second lower side unit 164L and the portion of the second fin active region pattern 124, which protrudes from the top surface of the device isolation layer pattern 130. The side surfaces of the second lower side unit 164L may be in contact with the first etch stop film 170, and a bottom surface of the second lower side unit 164L may be in contact with each of the second fin active region pattern 124 and the first spacer pattern 142. The first spacer pattern 142 may not be in contact with the side surfaces of the second lower side unit 164L. Accordingly, the uppermost end of the first spacer pattern 142 may be at a lower level than a lowermost end of the second upper side unit 164U. The first etch stop film 170 may be spaced apart from the first fin active region pattern 122 with the first spacer pattern 142 therebetween.

A lower interlayer insulating film 180 may be formed on the first source/drain region 162 and the second source/drain region 164. The lower interlayer insulating film 180 may fill spaces on both sides of the gate pattern GL. The lower interlayer insulating film 180 may cover the first source/drain region 162, the second source/drain region 164, and the gate spacer pattern 152. The lower interlayer insulating film 180 may include silicon oxide.

An upper interlayer insulating film 190 may be located on the lower interlayer insulating film 180, the gate pattern GL, and the gate spacer pattern 152. The upper interlayer insulating film 190 may include silicon oxide. In some example embodiments, the second etch stop film 182 may cover the lower interlayer insulating film 180, the gate pattern GL, and the gate spacer pattern 152, and the upper interlayer insulating film 190 may cover the second etch stop film 182. The second etch stop film 182 may include silicon nitride.

In the memory region 10 of the semiconductor device according to the inventive concepts, the first source/drain region 162 and the second source/drain region 164 may have the first lower side unit 162L and the second lower side unit 164L, respectively, which may have a lateral width greater than the lateral width of the top surface of the portion of the first fin active region pattern 122 and the second fin active region pattern 124 that protrudes from the top surface of the device isolation layer pattern 130. Accordingly, even when each of the first upper side unit 162U and the second upper side unit 164U is formed to have a relatively small volume, each of the first lower side unit 162L and the second lower side unit 164L may be formed to have a relatively large volume. Therefore, each of the first source/drain region 162 and the second source/drain region 164 may have a sufficient volume.

Accordingly, the occurrence of a short between the first source/drain region 162 and the second source/drain region 164 and degradation of operating characteristics of the semiconductor device may be reduced or prevented. As a result, reliability and operating characteristics of the semiconductor device having the memory region 10 may be improved.

Figure 4A:
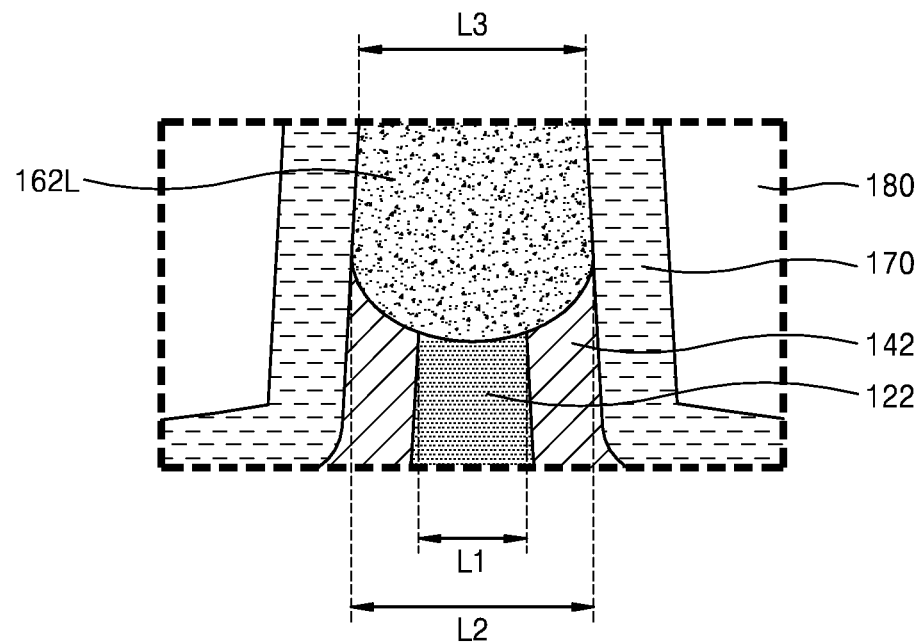
Figure 4B:
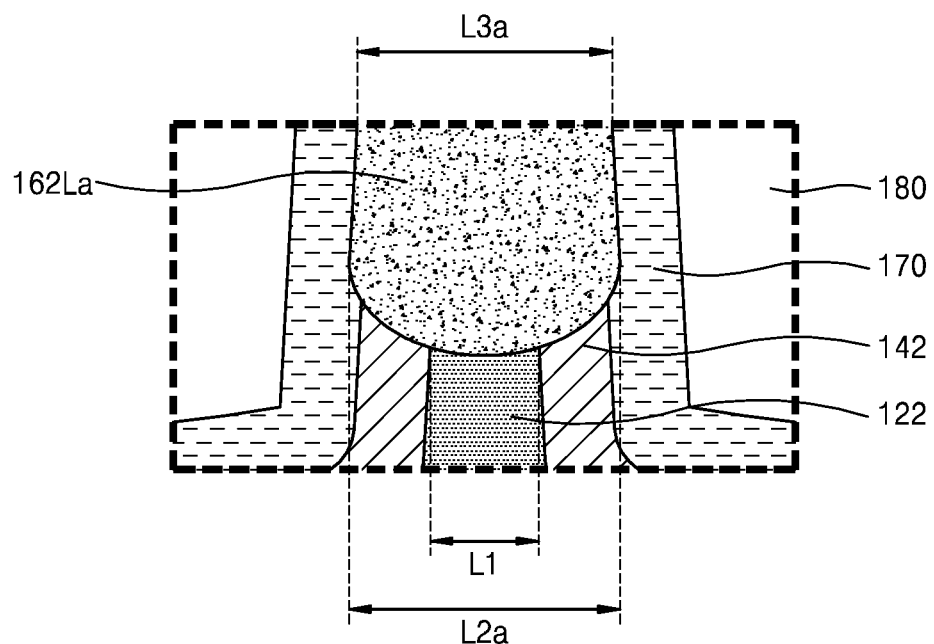
Figure 4C:
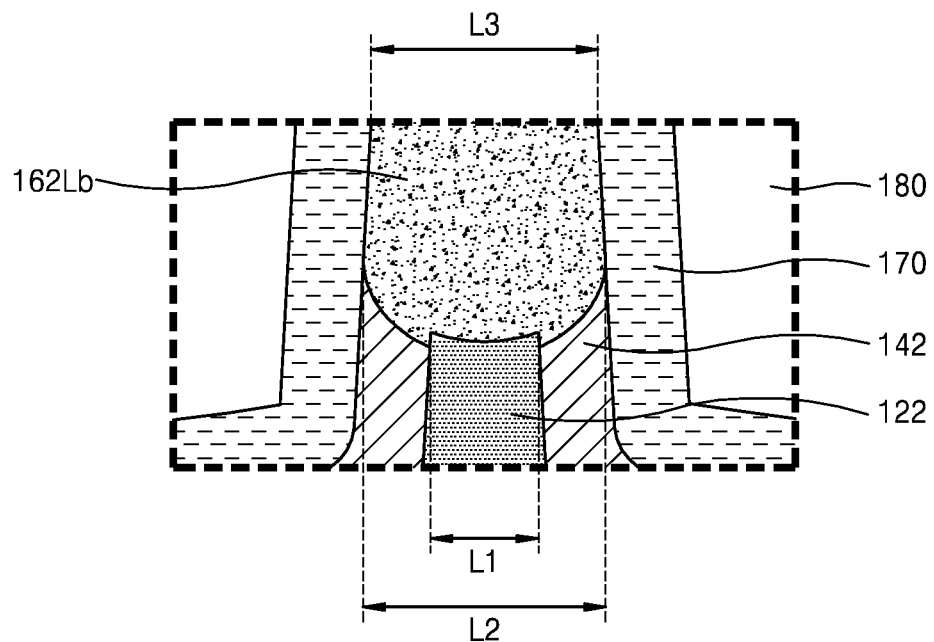
Figure 4D:
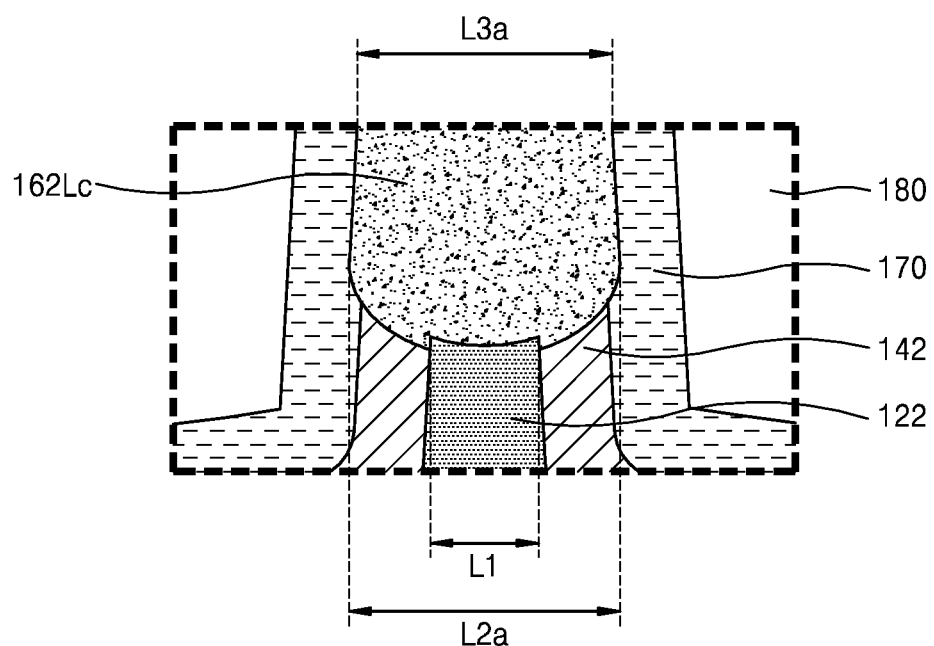

FIGS. 4A to 4D are diagrams of a semiconductor device according to an example embodiment. FIG. 4A is an enlarged cross-sectional view of a region IV of FIG. 3A, according to an example embodiment, and FIGS. 4B to 4D are enlarged cross-sectional views of the region IV of FIG. 3A, according to other example embodiments.

Referring to FIGS. 3A and 4A, an upper end of a first fin active region pattern 122 may have a first lateral width L1, and a lower end of a first lower side unit 162L of a first source/drain region 162 may have a second lateral width L2 that is greater than the first lateral width L1. An upper end of the first lower side unit 162L may have a third lateral width L3 that is less than the second lateral width L2. In some example embodiments, the third lateral width L3 may be greater than the first lateral width L1.

The first lower side unit 162L may be epitaxially grown from the first fin active region pattern 122. However, since the lateral width of the first lower side unit 162L is substantially greater than the lateral width of the portion of the first fin active region pattern 122, which protrudes from the device isolation layer pattern 130 in the third direction (Z direction), the first source/drain region 162 including the first lower side unit 162L may have a sufficient volume.

A bottom surface of the first lower side unit 162L may be in contact with the first fin active region pattern 122 and a first spacer pattern 142, and a side surface of the first lower side unit 162L may be in contact with a first etch stop film 170.

Semiconductor devices shown in FIGS. 4B to 4D may be substantially similar to the semiconductor devices shown in FIGS. 3A and 4A except that the semiconductor devices shown in FIGS. 4B to 4D have first lower side units 162La, 162Lb, and 162Lc, respectively, which correspond to the first lower side unit 162L shown in FIGS. 3A and 4A. Thus, the same descriptions as in FIGS. 3A and 4A will be omitted.

Referring to FIG. 4B, an upper end of a first fin active region pattern 122 may have a first lateral width L1, and a lower end of a first lower side unit 162La may have a second lateral width L2a that is greater than the first lateral width L1. An upper end of the first lower side unit 162La may have a third lateral width L3a that is less than the second lateral width L2a. In some example embodiments, the third lateral width L3a may be greater than the first lateral width L1.

A bottom surface of the first lower side unit 162La may be in contact with the first fin active region pattern 122, a first spacer pattern 142, and a first etch stop film 170. A side surface of the first lower side unit 162La may be in contact with the first etch stop film 170. That is, the second lateral width L2a, which is a lateral width of the lower end of the first lower side unit 162La, may be greater than the sum of a lateral width of each of the first fin active region pattern 122 in contact with the first lower side unit 162La and a lateral width of each of the first spacer pattern 142 in contact with the first lower side unit 162La. Accordingly, the first lower side unit 162La may ensure a sufficient volume.

Referring to FIG. 4C, an upper end of a first fin active region pattern 122 may have a first lateral width L1, a lower end of a first lower side unit 162Lb may have a second lateral width L2 that is greater than the first lateral width L1, and an upper end of the first lower side unit 162Lb may have a third lateral width L3, which is less than the second lateral width L2. In some example embodiments, the third lateral width L3 may be greater than the first lateral width L1.

In FIG. 4A, sidewalls of the upper end of the first fin active region pattern 122 may not be covered by the first lower side unit 162L but by the first spacer pattern 142. However, the first lower side unit 162Lb of FIG. 4C may cover side surfaces of a portion of the upper end of the first fin active region pattern 122. That is, upper portions of side surfaces of the upper end of the first fin active region pattern 122 may be covered by the first lower side unit 162Lb, while the remaining portions of the side surfaces of the upper end of the first fin active region pattern 122 may be covered by the first spacer pattern 142. Accordingly, the first lower side unit 162Lb may ensure a sufficient volume.

Referring to FIG. 4D, an upper end of a first fin active region pattern 122 may have a first lateral width L1, and a lower end of a first lower side unit 162Lc may have a second lateral width L2a that is greater than the first lateral width L1. An upper end of the first lower side unit 162Lc may have a third lateral width L3a that is less than the second lateral width L2a. In some example embodiments, the third lateral width L3a may be greater than the first lateral width L1.

A bottom surface of the first lower side unit 162Lc may be in contact with the first fin active region pattern 122, a first spacer pattern 142, and a first etch stop film 170, and side surfaces of the first lower side unit 162Lc may be in contact with the first etch stop film 170. That is, the second lateral width L2a, which is a lateral width of the lower end of the first lower side unit 162Lc, may be greater than the sum of a lateral width of the first fin active region pattern 122 in contact with the first lower side unit 162Lc and a lateral width of the first spacer pattern 142 in contact with the first lower side unit 162Lc.

In addition, the first lower side unit 162Lc may cover side surfaces of a portion of the upper end of the first fin active region pattern 122. That is, upper portions of side surfaces of the upper end of the first fin active region pattern 122 may be covered by the first lower side unit 162Lc, while the remaining portions of the side surfaces of the upper end of the first fin active region pattern 122 may be covered by the first spacer pattern 142. Accordingly, the first lower side unit 162Lc may ensure a sufficient volume.

FIGS. 5A to 5F are cross-sectional views of process operations of a method of manufacturing a semiconductor device, according to an example embodiment. FIGS. 5A to 5F are cross-sectional views of main components of portions corresponding to the cross-sectional view taken along the line A-A' of FIG. 2A.

Figure 5A:
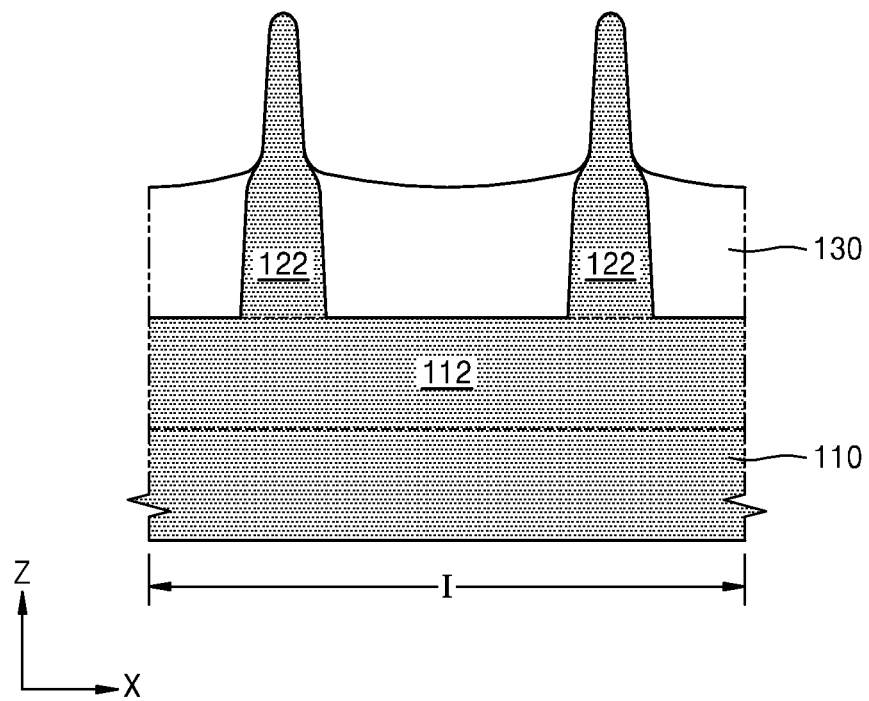

Referring to FIG. 5A, a first well region 112 may be formed in an upper portion of a first region I of a substrate 110, and first fin active region patterns 122 may be formed to protrude from the first well region 112 in a third direction (Z direction) that is perpendicular to a main surface of the substrate 110. For example, the first well region 112 and the first fin active region patterns 122 may be doped with N-type impurities.

Thereafter, a device isolation layer pattern 130 may be formed to cover lower portions of the first fin active region patterns 122. The formation of the device isolation layer pattern 130 may include forming a device isolation layer to completely cover the first fin active region patterns 122 and removing upper portions of the device isolation layer to expose portions of the first fin active region patterns 122. The device isolation layer may include a silicon-containing insulating film (e.g., a silicon oxide film, a silicon nitride film, a silicon oxynitride film, and a silicon carbonitride film), poly-Si, or a combination thereof. The device isolation layer pattern 130 may be formed using a PECVD process, an HDP CVD process, an ICP CVD process, a CCP CVD process, an FCVD process, and/or a spin coating process, but the inventive concepts are not limited thereto. The upper portions of the device isolation layer may be removed using, for example, an etchback process. Exposed portions of the first fin active region patterns 122 may be consumed during the removal of the upper portions of the device isolation layer, so that a lateral width of each of the upper portions of the first fin active region patterns 122 may be reduced.

Figure 5B:
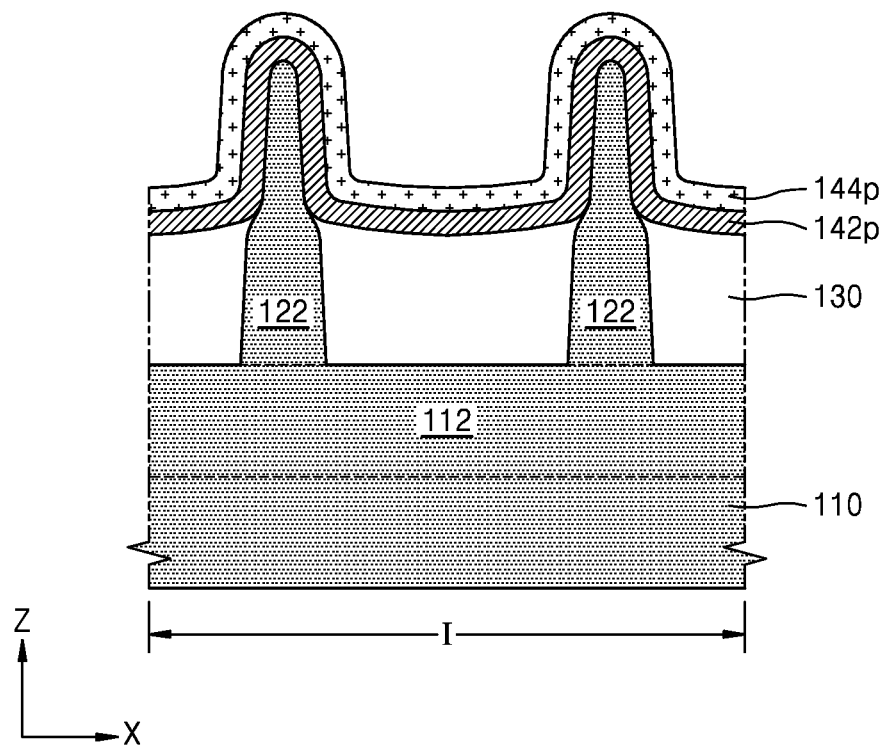

Referring to FIG. 5B, a first spacer layer 142p and a first protective layer 144p may be sequentially formed to cover the first fin active region pattern 122 and the device isolation layer pattern 130. The first spacer layer 142p may include, for example, silicon nitride (SiN), silicon oxynitride (SiON), or carbon-containing silicon oxynitride (SiOCN). The first protective layer 144p may include a material having an etch selectivity with respect to the first spacer layer 142p. The first protective layer 144p may include, for example, a metal oxide, a metal silicate, or a metal oxynitride. The first spacer layer 142p and the first protective layer 144p may be formed using an ALD process.

Figure 5C:
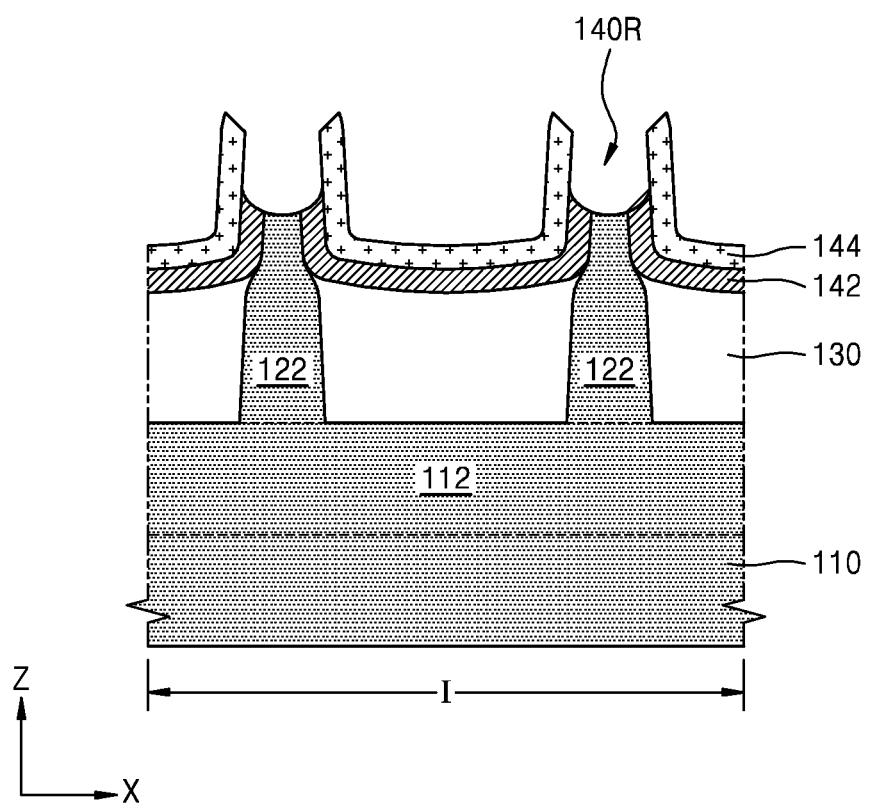

Referring to FIGS. 5B and 5C, portions of the first protective layer 144p located on the first fin active region patterns 122 may be removed to form first protective patterns 144 and expose the first spacer layer 142p and/or the first fin active region patterns 122. Thereafter, the first spacer layer 142p and the first fin active region patterns 122 may be selectively removed to form first spacer patterns 142. By performing an etching process having similar etching characteristics with respect to the first spacer layer 142p and the first fin active region patterns 122 and having an etch selectivity with respect to the first protective pattern 144, first spacer patterns 142 may be formed, and upper portions of the first fin active region patterns 122 may be removed. A portion of the first spacer layer 142p and the upper portions of the first fin active region patterns 122 may be removed by, for example, an etching process using fluorine (F)-containing etchant or etch gas.

Uppermost ends of the first spacer pattern 142 and the first fin active region patterns 122 may be at a lower level than uppermost ends of the first protective pattern 144. First recess spaces 140R may be formed on the first spacer pattern 142 and the first fin active region patterns 122 and defined by the first protective patterns 144.

FIG. 5C illustrates a case in which the first spacer pattern 142 and the first protective pattern 144 completely cover the top surface of the device isolation layer pattern 130, but the inventive concepts are not limited thereto. For example, a portion of the top surface of the device isolation layer pattern 130 may not be covered by the first protective pattern 144 and the first spacer pattern 142 but be exposed during the formation of the first protective pattern 144 and the first spacer pattern 142.

Figure 5D:
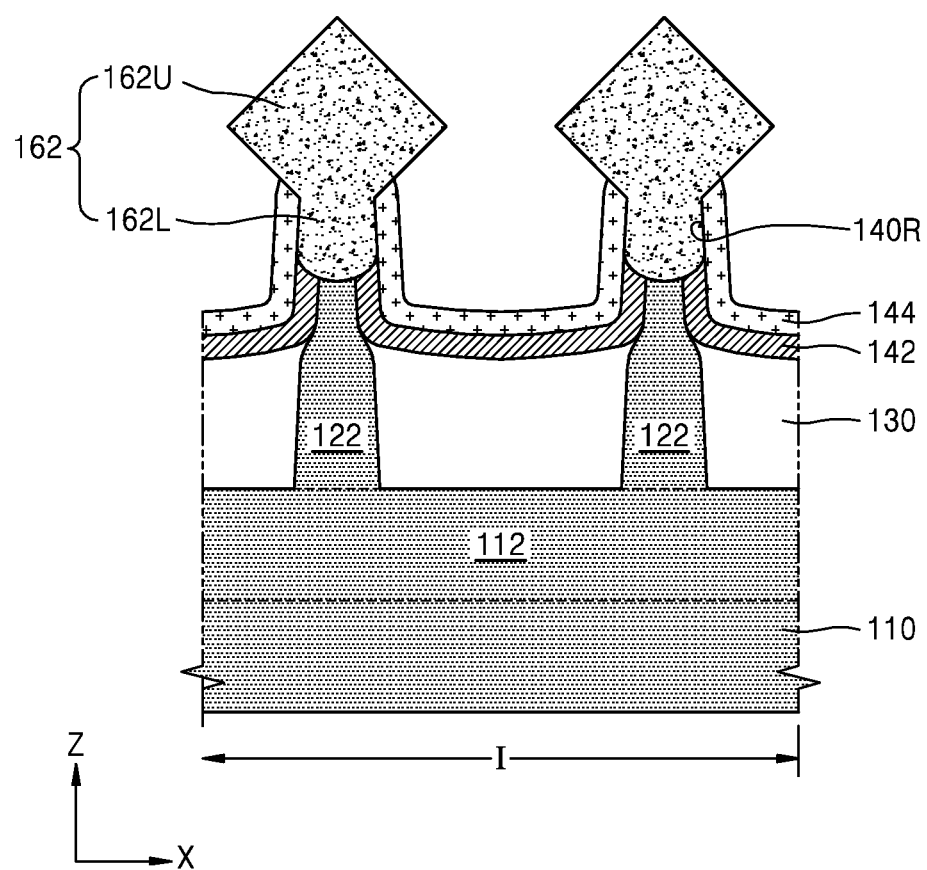

Referring to FIG. 5D, a first source/drain region 162 may be epitaxially grown from the first fin active region pattern 122. The first source/drain region 162 may include a first lower side unit 162L filling the first recess spaces 140R and a first upper side unit 162U located on the first lower side unit 162L. The first lower side unit 162L may be integrally formed with the first upper side unit 162U. Since the first lower side unit 162L is formed to fill the first recess space 140R, the first lower side unit 162L may be a lower portion of the first source/drain region 162, which has a relatively small lateral width. The first upper side unit 162U may refer to an upper portion of the first source/drain region 162, which may be located on the first lower side unit 162L and has a relatively great lateral width outside an upper side of the first recess space 140R. The first upper side unit 162U may have a polyhedral shape having facets.

The first lower side unit 162L may be a portion of the first source/drain region 162, which may be adjacent to the first fin active region pattern 122 and has a constant lateral width or a lateral width reducing away from the substrate 110 in the third direction (Z direction). The first upper side unit 162U may have a lateral width, which may increase and then decrease away from the first lower side unit 162L in the third direction (Z direction). Accordingly, an upper portion of the first upper side unit 162U may have a smaller lateral width than the first lower side unit 162L. An interface between the first upper side unit 162U and the first lower side unit 162L may be a point at which a lateral width of the first source/drain region 162 starts to increase away from the substrate 110 in the third direction (Z direction).

The lateral width of the first lower side unit 162L may be greater than a lateral width of a top surface of a portion of the first fin active region pattern 122, which protrudes from the top surface of the device isolation layer pattern 130. The lateral width of the first lower side unit 162L may be greater than the lateral width of the portion of the first fin active region pattern 122, which protrudes from the device isolation layer pattern 130 in the third direction (Z direction). A bottom surface of the first lower side unit 162L may be in contact with the first fin active region pattern 122 and the first spacer pattern 142. A lateral width of a portion of the first lower side unit 162L in contact with the first fin active region pattern 122 and the first spacer pattern 142 may be equal or similar to the sum of a lateral width of the first fin active region pattern 122 in contact with the first lower side unit 162L and a lateral width of the first spacer pattern 142 in contact with the first lower side unit 162L.

Figure 5E:
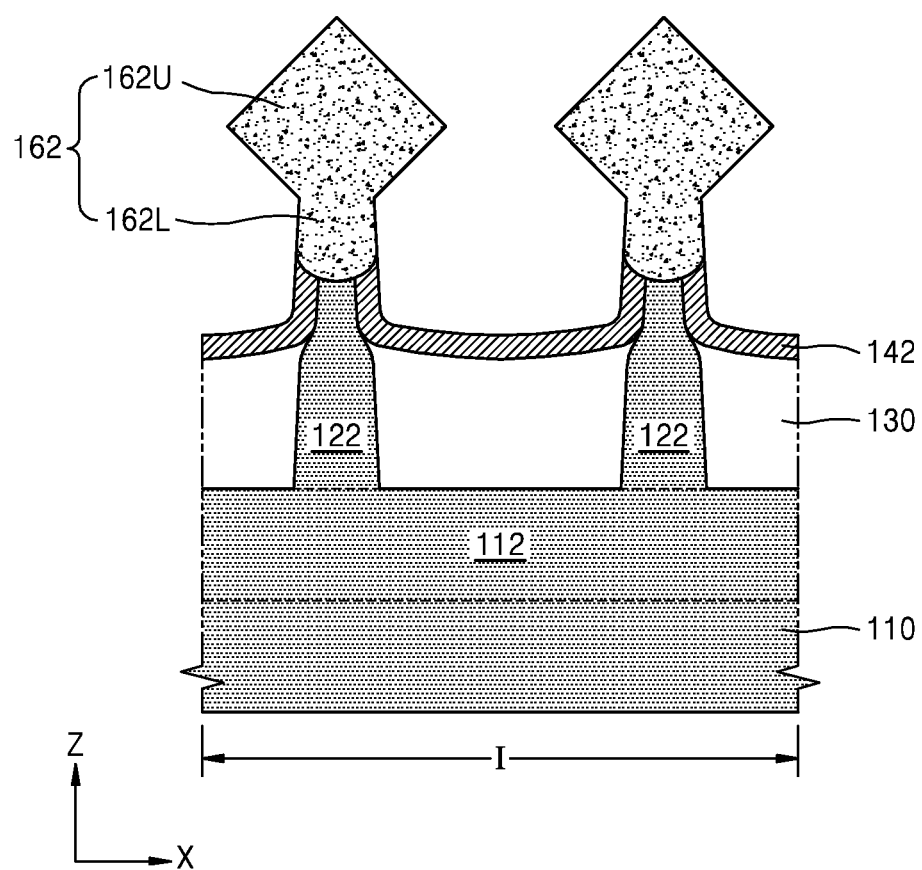

Referring to FIGS. 5D and 5E, the first protective pattern 144 may be selectively removed to expose side surfaces of the first lower side unit 162L and the first spacer pattern 142. The first protective pattern 144 may be removed using an etching process having an etch selectivity with respect to the first source/drain region 162 and the first spacer pattern 142. The first protective pattern 144 may be removed by means of an etching process using, for example, a fluorine (F)-free etchant or etch gas.

Figure 5F:
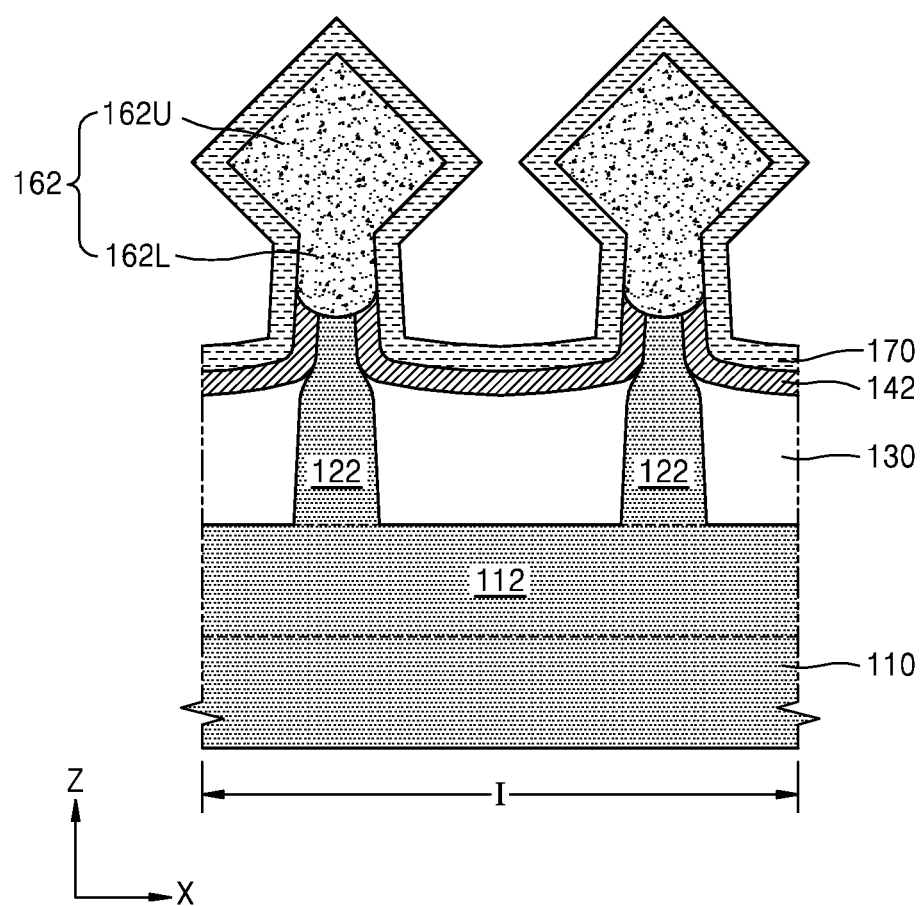

Referring to FIG. 5F, a first etch stop film 170 may be formed to cover the first source/drain region 162 and the first spacer pattern 142. The first etch stop film 170 may include, for example, a nitride. The first etch stop film 170 may surround the side surfaces of the first lower side unit 162L and the portion of the first fin active region pattern 122, which protrudes from the top surface of the device isolation layer pattern 130. The side surfaces of the first lower side unit 162L may be in contact with the first etch stop film 170, and the bottom surface of the first lower side unit 162L may be in contact with each of the first fin active region pattern 122 and the first spacer pattern 142. The first spacer pattern 142 may not be in contact with the side surfaces of the first lower side unit 162L.

Subsequently, as shown in FIG. 3A, a lower interlayer insulating film 180, a second etch stop film 182, and an upper interlayer insulating film 190 may be sequentially formed to form a memory region 10 of the semiconductor device.

The second region II of the substrate 110 of the memory region 10 shown in FIG. 3B may be doped with N-type impurities, and the second fin active region pattern 124 may be formed together with the first fin active region pattern 122. Thereafter, in addition to the first source/drain region 162, the second source/drain region 164 may be formed using a similar method to the method of forming the first source/drain region 162. Since the above-described method of forming the second fin active region pattern 124 is known to one skilled in the art, detailed descriptions thereof will be omitted here. In some example embodiments, after the first source/drain region 162 is formed, the second source/drain region 164 may be formed, but the inventive concepts are not limited thereto. For example, after the second source/drain region 164 is formed, the first source/drain region 162 may be formed.

Since one skilled in the art knows that the gate pattern GL shown in FIG. 3C may be formed using a replacement gate process, detailed descriptions thereof will be omitted.

Figure 6:
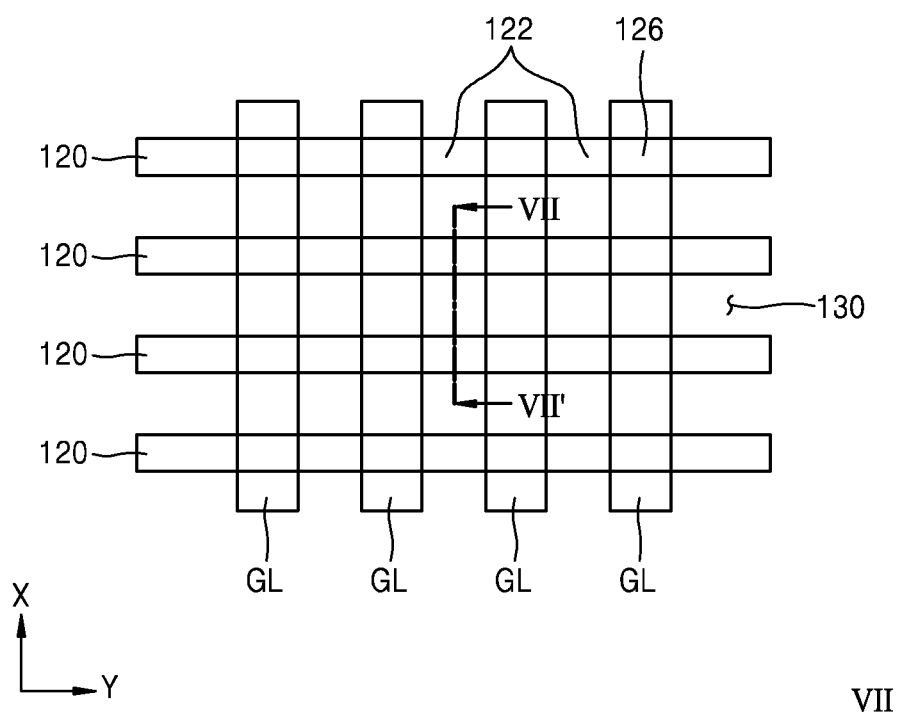
FIG. 6 is a plan view of main components of a logic device, which may be included in a logic region of a semiconductor device, according to an example embodiment.

FIG. 6 is a plan view of main components of a logic device, which may be included in a logic region 20 of a semiconductor device, according to an example embodiment.

Referring to FIG. 6, the logic region 20 may include fin active region patterns 120 having line or bar shapes, which may extend in a second direction (Y direction) parallel to a top surface of a substrate (refer to 110 in FIGS. 3A to 3C) and gate patterns GL, which may be parallel to the top surface of the substrate 110, intersect the fin active region patterns 120 at right angles, and extend in a first direction (X direction). A plurality of fin active region patterns 120 may be arranged in the first direction (X direction), and a plurality of gate patterns GL may be arranged in the second direction (Y direction). The fin active region patterns 120 may be surrounded by a device isolation layer pattern 130. At least some of the fin active region patterns 120 may include a first fin active region pattern 122, which may not overlap the gate pattern GL, and a third fin active region pattern 126, which may overlap the gate pattern GL. In some example embodiments, at least some of the fin active region patterns 120 may include a second fin active region pattern (refer to 124 in FIG. 2A), which may not overlap the gate pattern GL as shown in FIG. 2A. The first fin active region pattern 122 and the second fin active region pattern 124 may be formed adjacent to the gate patterns GL. A top surface of the third fin active region pattern 126 may be at a higher level than a top surface of the first fin active region pattern 122 and a top surface of the second fin active region pattern 124.

According to an example embodiment, the first fin active region pattern 122 and the third fin active region pattern 126 may be surrounded by the device isolation layer pattern 130, and the third fin active region pattern 126 may protrude from a top surface of the device isolation layer pattern 130. In some example embodiments, an upper portion of the first fin active region pattern 122 may protrude from the top surface of the device isolation layer pattern 130, and an upper portion of the third fin active region pattern 126 may protrude from the top surface of the device isolation layer pattern 130 over the first fin active region pattern 122.

For example, the first fin active region pattern 122 may be a region in which a third source/drain region (refer to 166 of FIG. 9, 166a of FIG. 10, or 166b of FIG. 11) will be formed, and the third fin active region pattern 126 may be a region in which a channel will be formed.

Figure 7A:
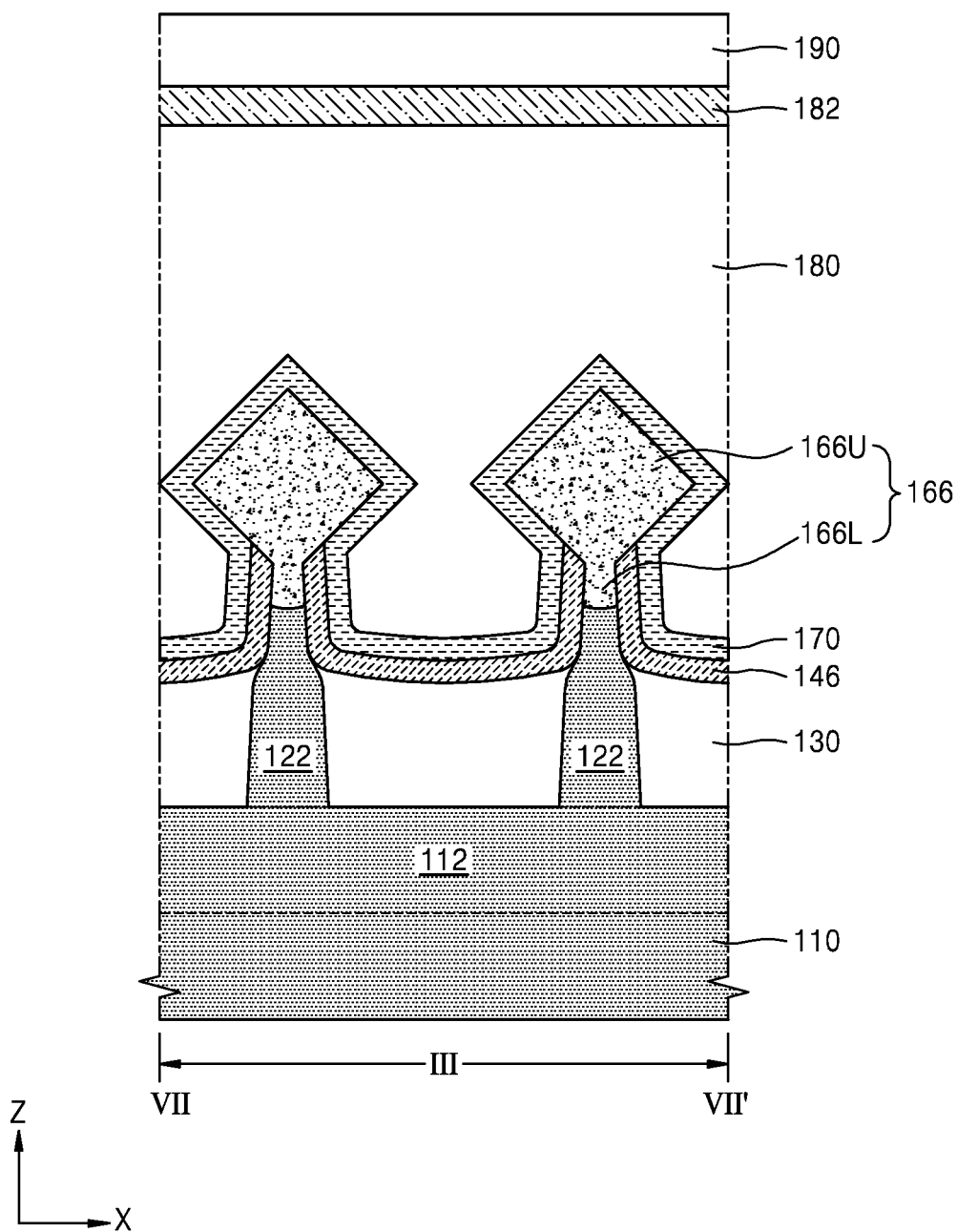
Figure 7B:
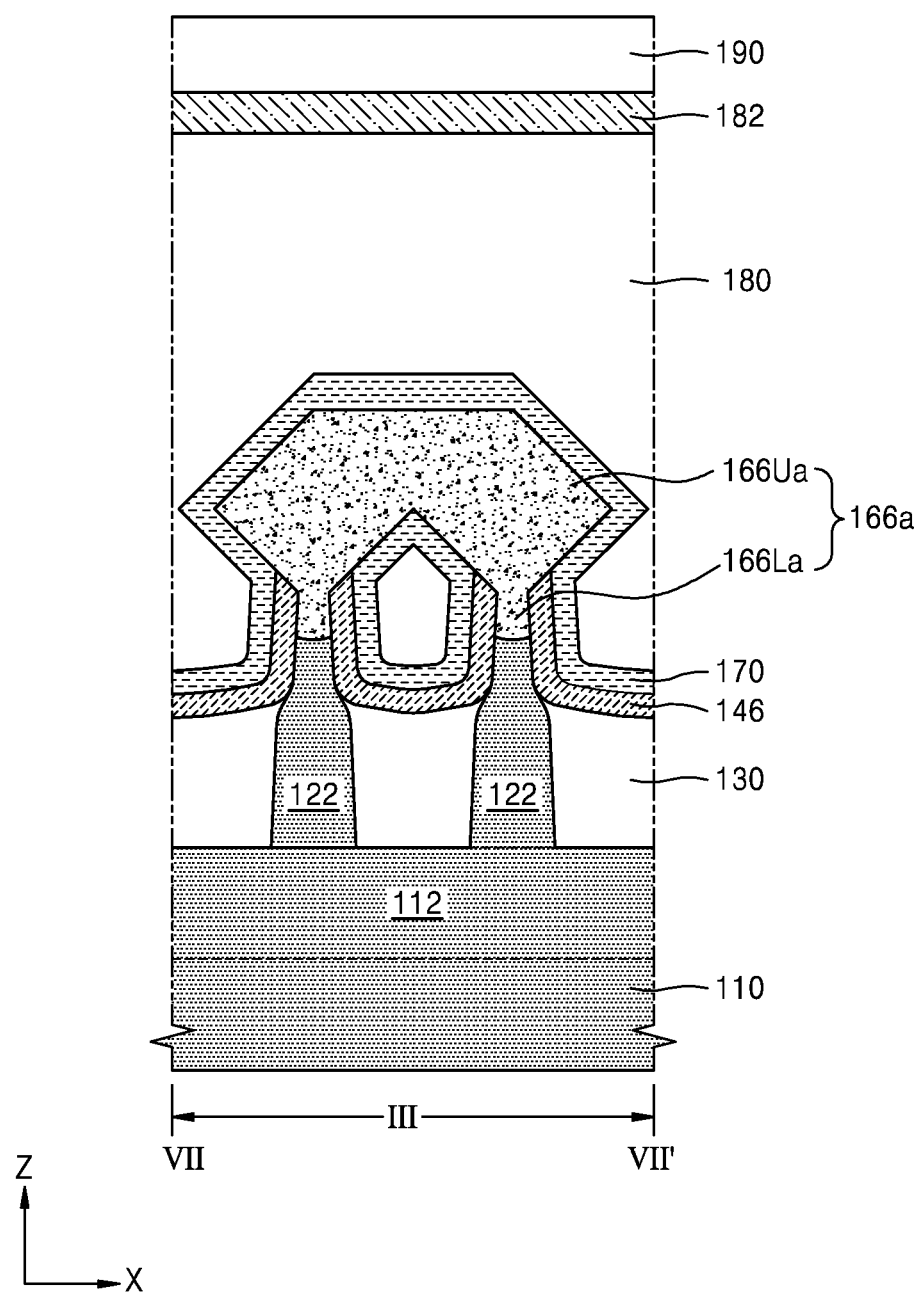

FIGS. 7A and 7B are diagrams of a semiconductor device according to an example embodiment. FIG. 7A is a cross-sectional view taken along a line VII-VII' of FIG. 6, according to an example embodiment. FIG. 7B is a cross-sectional view of a portion corresponding to the cross-sectional view taken along the line VII-VII' of FIG. 6, according to another example embodiment.

Referring to FIG. 7A, a logic region 20 may include a substrate 110 having a third region III, a first well region 112 formed in an upper portion of the third region III of the substrate 110, and a first fin active region pattern 122 protruding from the first well region 112 in a third direction (Z direction) that is perpendicular to a main surface of the substrate 110. In some example embodiments, the first well region 112 may be doped with N-type impurities. In some example embodiments, the first fin active region pattern 122 may be doped with N-type impurities.

The first fin active region pattern 122 may be surrounded by a device isolation layer pattern 130, and an upper portion of the first fin active region pattern 122 may protrude from a top surface of the device isolation layer pattern 130.

A third source/drain region 166 may be located on the first fin active region pattern 122.

A second spacer pattern 146 may cover side surfaces of a portion of the first fin active region pattern 122, which protrudes from the top surface of the device isolation layer pattern 130 and side surfaces of a third lower side unit 166L of the third source/drain region 166. The second spacer pattern 146 may not cover a top surface of the portion of the first fin active region pattern 122, which protrudes from the top surface of the device isolation layer pattern 130. In some example embodiments, the second spacer pattern 146 may cover the side surfaces of the portion of the first fin active region pattern 122, the side surfaces of the third lower side unit 166L of the third source/drain region 166, and the top surface of the device isolation layer pattern 130.

The second spacer pattern 146 may include silicon nitride (SiN), silicon oxynitride (SiON), or carbon (C)-containing silicon oxynitride (SiOCN). In some example embodiments, the second spacer pattern 146 may include carbon-containing silicon oxynitride (SiOCN).

The third source/drain region 166 may include a semiconductor layer that is epitaxially grown from the first fin active region pattern 122. A bottom surface of the third source/drain region 166 may be in contact with the top surface of the first fin active region pattern 122, which may protrude from the top surface of the device isolation layer pattern 130. The third source/drain region 166 may include an embedded SiGe structure including a plurality of epitaxially grown SiGe layers, an epitaxially grown silicon (Si) layer, or an epitaxially grown silicon carbide (SiC) layer. For example, the third source/drain region 166 may be doped with P-type impurities.

The third source/drain region 166 may include a third lower side unit 166L and a third upper side unit 166U located on the third lower side unit 166L. The third lower side unit 166L may be integrally formed with the third upper side unit 166U. The third lower side unit 166L may be a lower portion of the third source/drain region 166, which has a relatively small lateral width, and the third upper side unit 166U may refer to an upper portion of the third source/drain region 166, which is located on the third lower side unit 166L and has a relatively great lateral width. The third upper side unit 166U may have a polyhedral shape having facets.

Specifically, the third lower side unit 166L may be a portion of the third source/drain region 166, which is adjacent to the first fin active region pattern 122 and has a constant lateral width or a lateral width reducing away from the substrate 110 in the third direction (Z direction). The third upper side unit 166U may have a lateral width, which may increase and then decrease away from the third lower side unit 166L in the third direction (Z direction). Accordingly, an upper portion of the third upper side unit 166U may have a smaller lateral width than the third lower side unit 166L. An interface between the third upper side unit 166U and the third lower side unit 166L may be a point at which a lateral width of the third source/drain region 166 starts to increase away from the substrate 110 in the third direction (Z direction).

The lateral width of the third lower side unit 166L may be equal or similar to a lateral width of the top surface of the portion of the first fin active region pattern 122, which protrudes from the top surface of the device isolation layer pattern 130. A bottom surface of the third lower side unit 166L may be in contact with the first fin active region pattern 122.

A first etch stop film 170 may cover the third source/drain region 166 and the second spacer pattern 146. The first etch stop film 170 may surround side surfaces of the first lower side unit 162L. The first etch stop film 170 may be spaced apart from the first fin active region pattern 122 and the third lower side unit 146L with the second spacer pattern 146 therebetween. Side surfaces of the third lower side unit 166L may be in contact with the first spacer pattern 142, and the bottom surface of the third lower side unit 166L may be in contact with the first fin active region pattern 122.

A lower interlayer insulating film 180 may be formed on the third source/drain region 166. An upper interlayer insulating film 190 may be located on the lower interlayer insulating film 180. In some example embodiments, a second etch stop film 182 may cover the lower interlayer insulating film 180, and the upper interlayer insulating film 190 may cover the second etch stop film 182.

In addition, although not additionally shown, the logic region 20 may have a fourth region similar to the second region II of FIG. 3B. A source/drain region including an upper side unit and a lower side unit may be formed in the fourth region, the upper side unit of the source/drain region may have a similar shape to the second upper side unit 164U of the second source/drain region 164, and the lower side unit of the source/drain region may have a similar shape to the third lower side unit 166L of the third source/drain region 166 shown in FIG. 7A.

Referring to FIG. 7B, a logic region 20a may include a substrate 110 having a third region III, a first well region 112 formed in an upper portion of a first region I of the substrate 110, and first fin active region patterns 122, which may protrude from the first well region 112 in a third direction (Z direction) perpendicular to a main surface of the substrate 110. A third source/drain region 166a may be located on the first fin active region patterns 122. The third source/drain region 166a may include a plurality of third lower side units 166La located on a plurality of first fin active region patterns 122, respectively, and a third upper side unit 166Ua connected to the plurality of third lower side units 166La.

Although FIG. 7B illustrates a case in which the third upper side unit 166Ua is connected to two third lower side units 166La located on two first fin active region patterns 122, the inventive concepts are not limited thereto. For example, the third upper side unit 166Ua may be connected to at least three third lower side units 166La located on at least three first fin active region patterns 122.

FIGS. 8A to 8F are cross-sectional views of process operations of a method of manufacturing a semiconductor device according to an example embodiment. FIGS. 8A to 8F are cross-sectional views of main components of portions corresponding to the cross-sectional view taken along the line VII-VII' of FIG. 6.

Figure 8A:
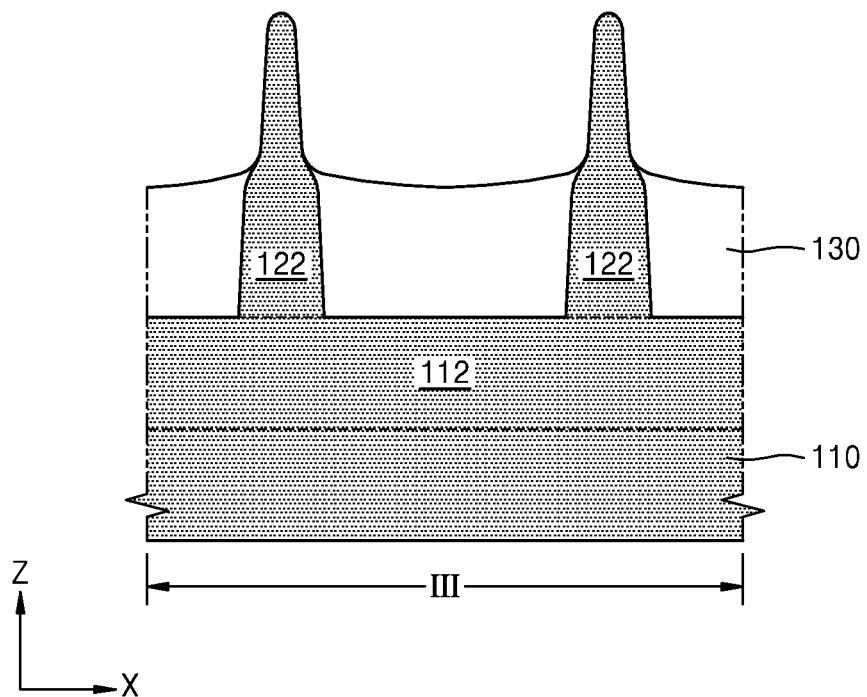

Referring to FIG. 8A, a first well region 112 may be formed in an upper portion of a third region III of a substrate 110, and first fin active region patterns 122 may be formed to protrude from the first well region 112 in a third direction (Z direction) perpendicular to a main surface of the substrate 110. For example, the first well region 112 and the first fin active region patterns 122 may be doped with N-type impurities.

Thereafter, a device isolation layer pattern 130 may be formed to cover lower portions of the first fin active region patterns 122. The formation of the device isolation layer pattern 130 may include forming a device isolation layer to completely cover the first fin active region patterns 122 and removing upper portions of the device isolation layer to expose portions of the first fin active region patterns 122. Exposed portions of the first fin active region patterns 122 may be consumed during the removal of the upper portions of the device isolation layer, so that a lateral width of each of the upper portions of the first fin active region patterns 122 may be reduced.

Figure 8B:
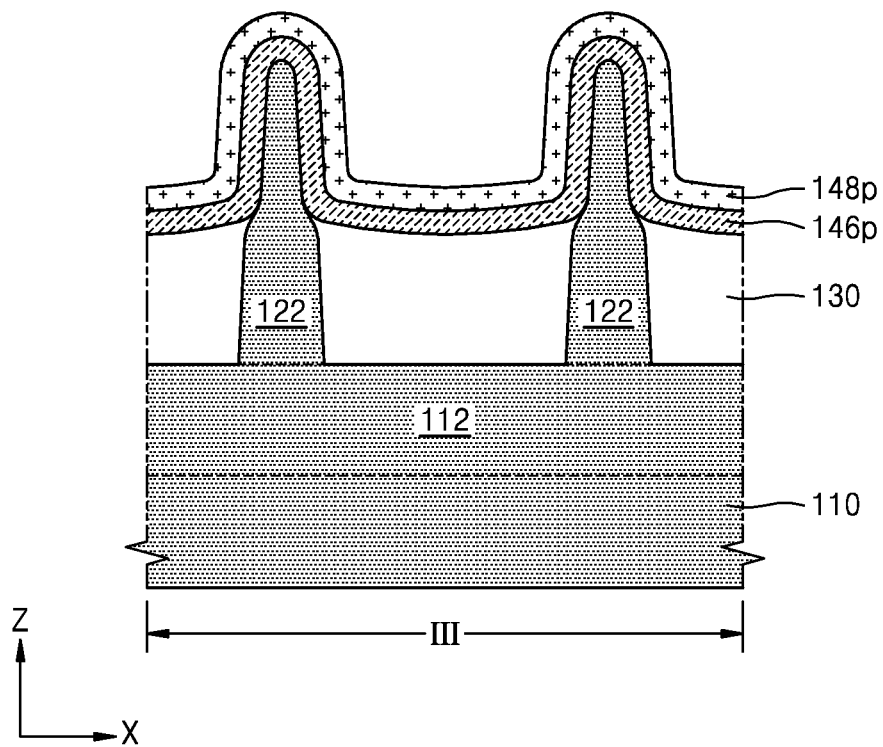

Referring to FIG. 8B, a second spacer layer 146p and a second protective layer 148p may be sequentially formed to cover the first fin active region patterns 122 and the device isolation layer pattern 130. The second spacer layer 146p may include, for example, silicon nitride (SiN), silicon oxynitride (SiON), or carbon-containing silicon oxynitride (SiOCN). In some example embodiments, the second spacer layer 146p may include carbon-containing silicon oxynitride (SiOCN). The second protective layer 148p may include a material having an etch selectivity with respect to the second spacer layer 146p. The second protective layer 148p may include, for example, silicon oxide. The second spacer layer 146p and the second protective layer 148p may be formed using an ALD process.

Figure 8C:
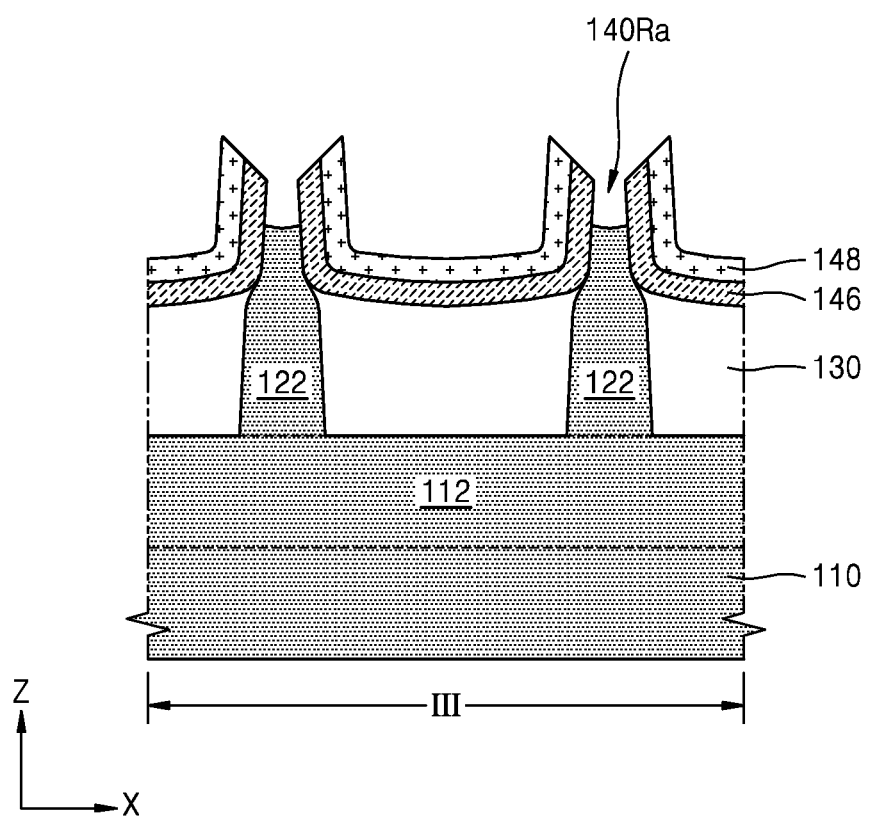

Referring to FIGS. 8B and 8C, portions of the second protective layer 148p and portions of the second spacer layer 146p, which are located on the first fin active region patterns 122, may be removed to form second protective patterns 148 and second spacer patterns 146 and expose the first fin active region patterns 122. Thereafter, the first fin active region patterns 122 may be selectively removed so that uppermost ends of the first fin active region patterns 122 may be formed at a lower level than uppermost ends of the second spacer patterns 146 and the second protective patterns 148.

Second recess spaces 140Ra may be formed on the first fin active region patterns 122 and defined by the second spacer patterns 146.

Although FIG. 8C illustrates a case in which the second spacer patterns 146 and the second protective patterns 148 completely cover a top surface of the device isolation layer pattern 130, the inventive concepts are not limited thereto. For example, during the formation of the second protective patterns 148 and the second spacer patterns 146, a portion of the top surface of the device isolation layer pattern 130 may not be covered by the second protective patterns 148 and the second spacer patterns 146 but be exposed.

Figure 8D:
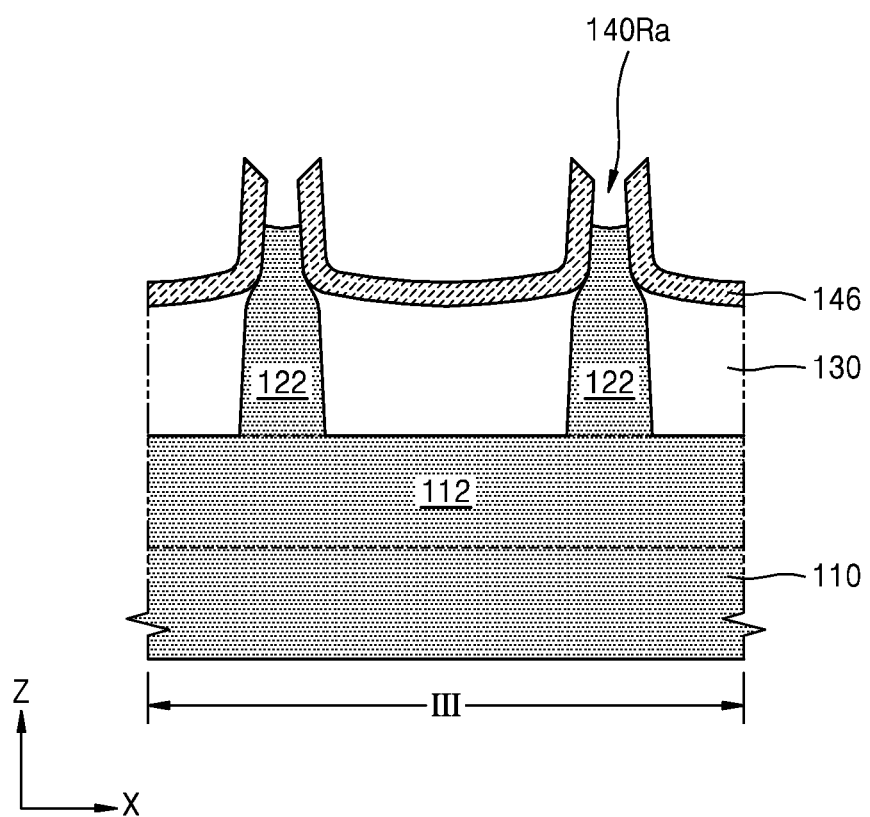
Figure 8E:
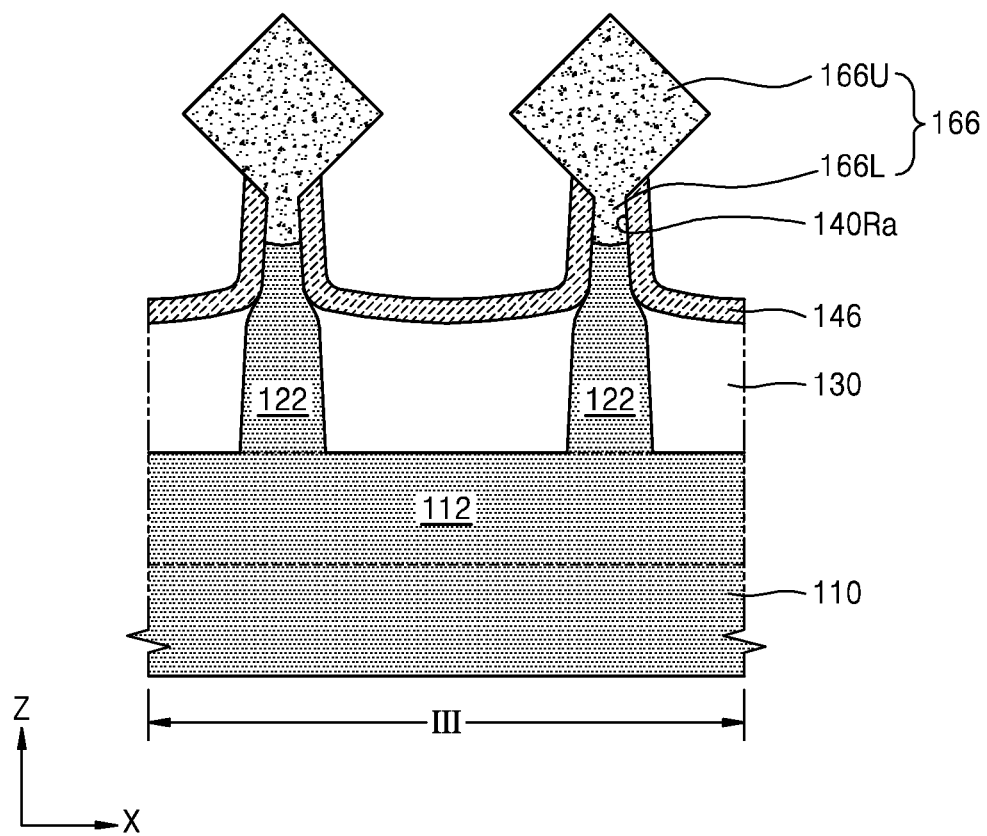

Referring to FIGS. 8C and 8D, the second protective patterns 148 may be selectively removed to expose the second spacer patterns 146.

Referring to FIG. 8C, third source/drain regions 166 may be epitaxially grown form the first fin active region patterns 122. Each of the third source/drain regions 166 may include a third lower side unit 166L filling the second recess space 140Ra and a third upper side unit 166U located on the third lower side unit 166L. The third lower side unit 166L may be integrally formed with the third upper side unit 166U. Since the third lower side unit 166L is formed to fill the second recess space 140Ra, the third lower side unit 166L may be a lower portion of the third source/drain region 166, which has a relatively small lateral width. The third upper side unit 166U may refer to an upper portion of the third source/drain region 166, which is located on the third lower side unit 166L and has a relatively great lateral width outside an upper side of the second recess space 140Ra. The third upper side unit 166U may have a polyhedral shape having facets.

The third lower side unit 166L may be a portion of the third source/drain region 166, which may be adjacent to the first fin active region pattern 122 and has a constant lateral width or a lateral width reducing away from the substrate 110 in the third direction (Z direction). The third upper side unit 166U may have a lateral width, which may increase and then decrease away from the third lower side unit 166L in the third direction (Z direction). Accordingly, an upper portion of the third upper side unit 166U may have a smaller lateral width than the third lower side unit 166L. An interface between the third upper side unit 166U and the third lower side unit 166L may be a point at which a lateral width of the third source/drain region 166 starts to increase away from the substrate 110 in the third direction (Z direction).

The lateral width of the third lower side unit 166L may be equal or similar to a lateral width of a top surface of a portion of the first fin active region pattern 122, which protrudes from the top surface of the device isolation layer pattern 130. A bottom surface of the third lower side unit 166L may be in contact with the first fin active region patterns 122. Since one skilled in the art knows that the third source/drain region 166a shown in FIG. 7B may be formed by connecting adjacent third upper side units 166U shown in FIG. 8E during the formation of the third source/drain region 166, detailed descriptions thereof will be omitted.

Figure 8F:
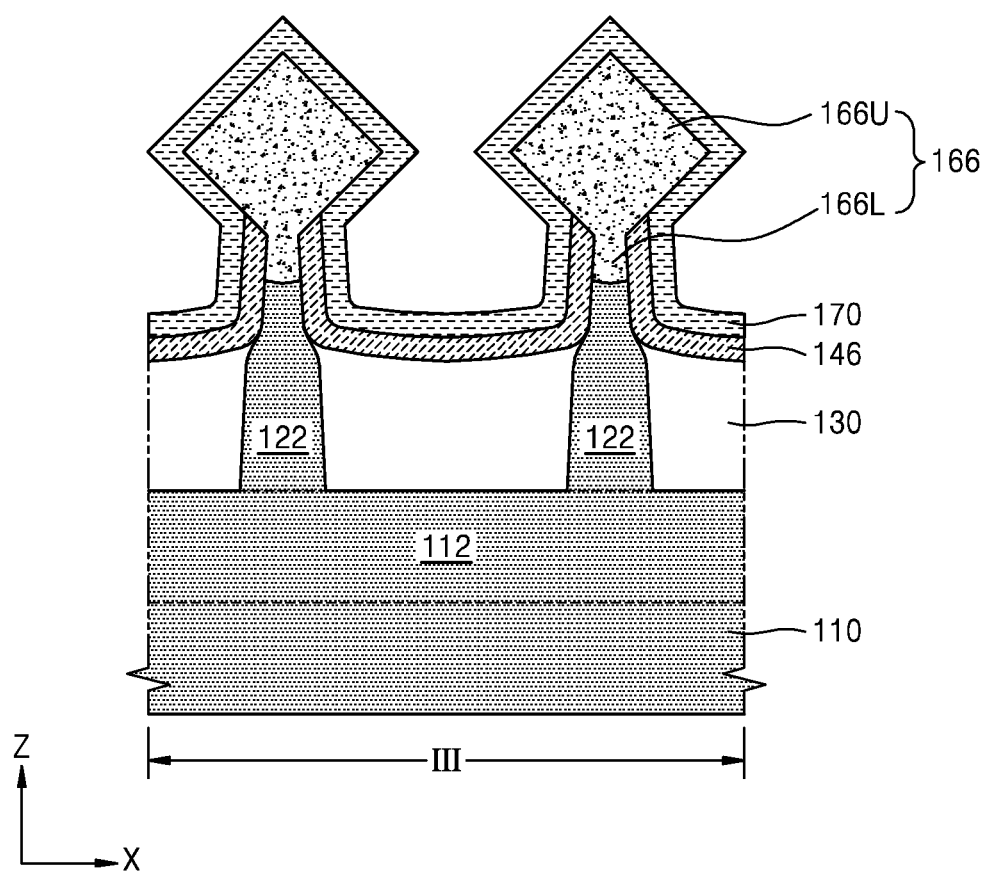

Referring to FIG. 8F, a first etch stop film 170 may be formed to cover the third source/drain regions 166 and the second spacer patterns 146. Side surfaces of the first lower side unit 162L may be in contact with the second spacer patterns 146, and a bottom surface of the first lower side unit 162L may be in contact with the first fin active region patterns 122.

Subsequently, as shown in FIG. 7A, a lower interlayer insulating film 180, a second etch stop film 182, and an upper interlayer insulating film 190 may be sequentially formed to form a logic region 20 of the semiconductor device.

Figure 9:
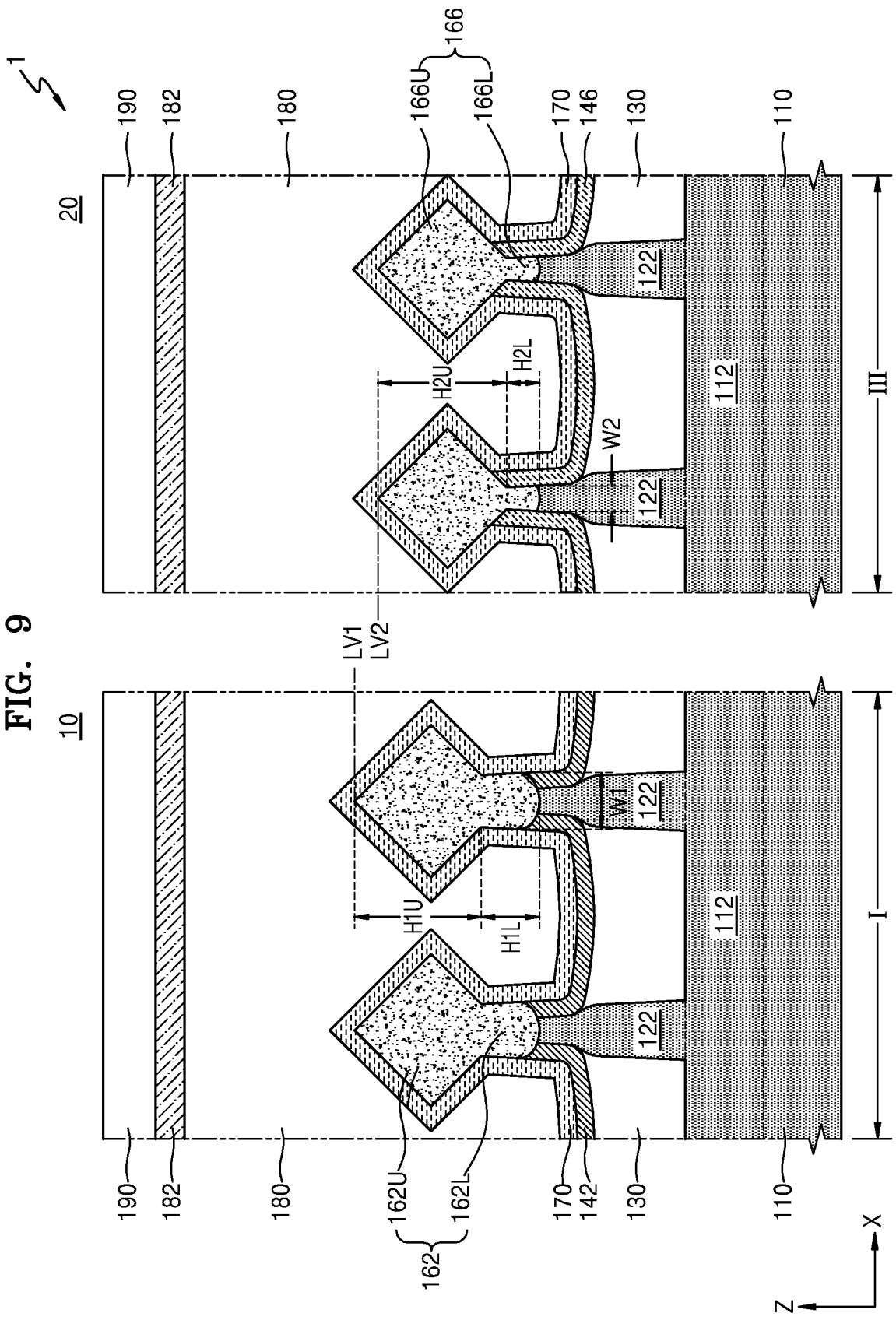
FIGS. 9 to 11 are cross-sectional views of main components of a memory device, which may be included in a memory region of a semiconductor device, and main components of a logic device, which may be included in a logic region of the semiconductor device, according to example embodiments.
Figure 10:
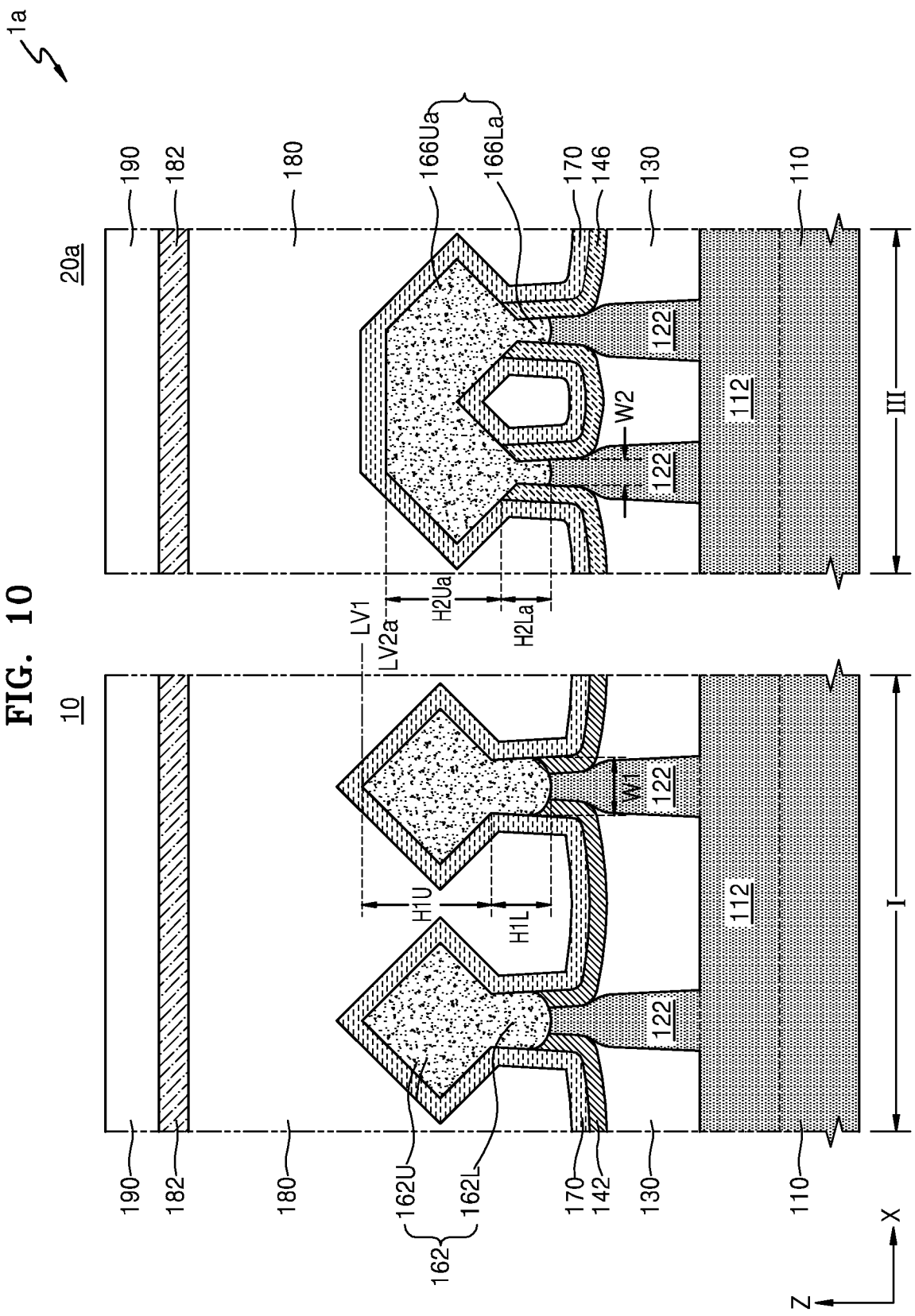
Figure 11:
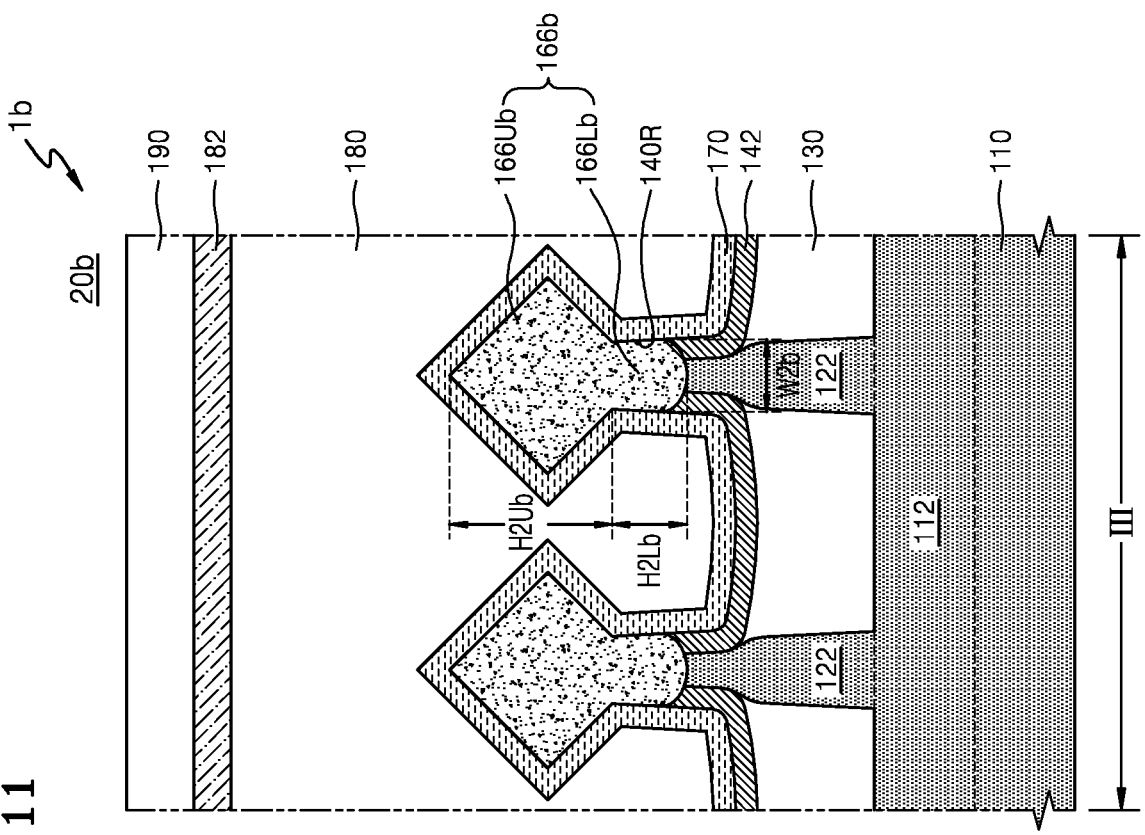
Figure 11:
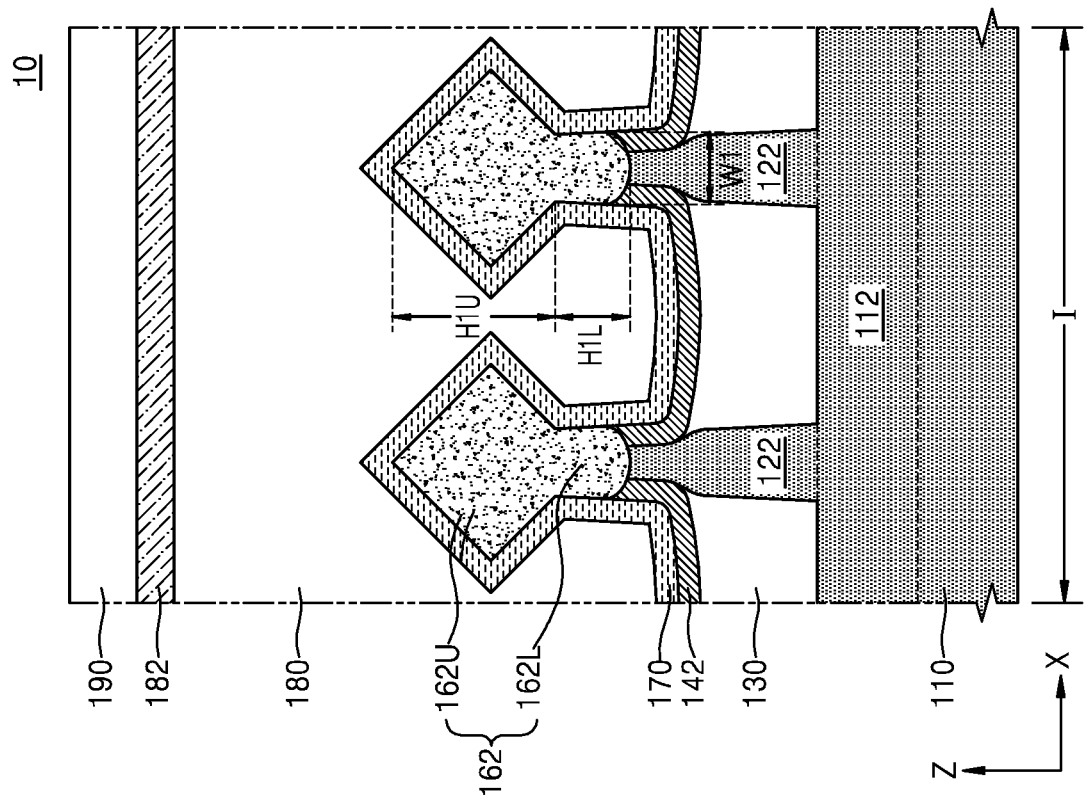

FIGS. 9 to 11 are cross-sectional views of main components of a memory device, which may be included in a memory region of a semiconductor device, and main components of a logic device, which may be included in a logic region of the semiconductor device, according to example embodiments.

Referring to FIG. 9, a semiconductor device 1 may include a memory region 10 and a logic region 20. Since the memory region 10 and the logic region 20 are substantially the same as the memory region 10 of FIG. 3A and the logic region 20 of FIG. 7A, detailed descriptions thereof will be omitted.

Each of first source/drain regions 162 may include a first lower side unit 162L and a first upper side unit 162U located on the first lower side unit 162L. Each of third source/drain regions 166 may include a third lower side unit 166L and a third upper side unit 166U located on the third lower side unit 166L.

In some example embodiments, an uppermost end LV1 of the first source/drain regions 162 may be at a higher level than an uppermost end LV2 of the third source/drain regions 166.

An uppermost end of first spacer patterns 142 may be at a higher level than an uppermost end of second spacer patterns 146. Accordingly, a width W1 of a bottom surface of the first lower side unit 162L may be greater than a width W2 of a bottom surface of the third lower side unit 166L. For example, the width W2 of the bottom surface of the third lower side unit 166L may be a width of a top surface of the first fin active region pattern 122. Accordingly, the width W1 of the bottom surface of the first lower side unit 162L may be greater than the width of the top surface of the first fin active region pattern 122.

In some example embodiments, a height H1L of the first lower side unit 162L may be greater than a height H2L of the third lower side unit 166L. Accordingly, a volume of the first lower side unit 162L may be greater than a volume of the third lower side unit 166L.

A height H1U of the first upper side unit 162U may be equal to or greater than a height H2U of the third upper side unit 166U. When the height H1U of the first upper side unit 162U is equal to the height H2U of the third upper side unit 166U, a volume of the first upper side unit 162U may be equal or similar to a volume of the third upper side unit 166U. However, since the first source/drain region 162 has the first lower side unit 162L with a relatively large volume, the first source/drain region 162 may have a greater volume than the third source/drain region 166 having the third lower side unit 166L with a relatively small volume.

Referring to FIG. 10, a semiconductor device 1a may include a memory region 10 and a logic region 20a. Since the memory region 10 and the logic region 20a are substantially the same as the memory region 10 of FIG. 3A and the logic region 20a of FIG. 7B, detailed descriptions thereof will be omitted.

A first source/drain region 162 may include a first lower side unit 162L and a first upper side unit 162U located on the first lower side unit 162L. A third source/drain region 166a may include a plurality of third lower side units 166La and a third upper side unit 166Ua located on the plurality of third lower side units 166La.

In some example embodiments, an uppermost end LV1 of the first source/drain region 162 may be at a higher level than an uppermost end LV2a of the third source/drain region 166a.

A width W1 of a bottom surface of the first lower side unit 162L may be greater than a width W2 of a bottom surface of each of the third lower side units 166La. For example, the width W2 of the bottom surface of each of the third lower side units 166La may be a width of a top surface of each of first fin active region patterns 122.

In some example embodiments, a height H1L of the first lower side unit 162L may be greater than a height H2La of the third lower side units 166La. A height H1U of the first upper side unit 162U may be equal to or greater than a height H2Ua of the third upper side unit 166Ua.

Referring to FIG. 11, a semiconductor device 1b may include a memory region 10 and a logic region 20b. Since the memory region 10 is substantially the same as the memory region 10 of FIG. 3A, detailed descriptions thereof will be omitted. A first source/drain region 162 may include a first lower side unit 162L and a first upper side unit 162U located on the first lower side unit 162L.

The logic region 20b may include a third source/drain region 166b. The third source/drain region 166b may include a third lower side unit 166Lb and a third upper side unit 166Ub located on the third lower side unit 166Lb. Since the third source/drain region 166b of the logic region 20b is similar to the first source/drain region 162, detailed descriptions thereof will be omitted. That is, in the semiconductor device 1b shown in FIG. 11, the third source/drain region 166b of the logic region 20b may be formed using the method of manufacturing the third source/drain region 166b, which is described with reference to FIGS. 5A to 5F. In some example embodiments, the uppermost end LV1 of the first source/drain region 162 may be at the same level as the uppermost end LV2a of the third source/drain region 166b.

A width W1 of a bottom surface of the first lower side unit 162L may be substantially equal to a width W2b of a bottom surface of the third lower side unit 166Lb. Accordingly, each of the width W1 of the bottom surface of the first lower side unit 162L and the width W2b of the bottom surface of the third lower side unit 166Lb may be greater than a width of a top surface of each of first fin active region patterns 122.

Similarly, a height H1L of the first lower side unit 162L may be substantially equal to a height H2Lb of the third lower side unit 166Lb, and a height H1U of the first upper side unit 162U may be substantially equal to a height H2Ub of the third upper side unit 166Ub.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
a substrate having a fin active region pattern having a protruding shape;
a device isolation layer pattern covering a side surface of a lower portion of the fin active region pattern;
a spacer pattern covering a side surface of a portion of the fin active region pattern, the portion of the fin active region pattern protruding from a top surface of the device isolation layer pattern; and
a source/drain region in contact with a top surface of the fin active region pattern and a top surface of the spacer pattern,
wherein the source/drain region comprises a lower side unit having a constant lateral width or a lateral width reducing away from the substrate in a vertical direction, and an upper side unit having a lateral width that increases and then decreases away from the lower side unit in the vertical direction, and
the lateral width of the lower side unit is greater than a lateral width of the portion of the fin active region pattern protruding from the top surface of the device isolation layer pattern.

2. The semiconductor device of claim 1, further comprising an etch stop film covering the source/drain region and the spacer pattern,
wherein the etch stop film is in contact with a side surface of the lower side unit of the source/drain region.

3. The semiconductor device of claim 2, wherein the etch stop film is spaced apart from the fin active region pattern with the spacer pattern therebetween.

4. The semiconductor device of claim 2, wherein a bottom surface of the lower side unit is in contact with the fin active region pattern, the spacer pattern, and the etch stop film.

5. The semiconductor device of claim 1, wherein a lateral width of a portion of the lower side unit in contact with the fin active region pattern and the spacer pattern is equal to a sum of a lateral width of a portion of the fin active region pattern in contact with the lower side unit and a lateral width of a portion of the spacer pattern in contact with the lower side unit.

6. The semiconductor device of claim 1, wherein a side surface of a portion of an uppermost end of the fin active region pattern is covered by the lower side unit, and a side surface of a remaining portion of the uppermost end of the fin active region pattern is covered by the spacer pattern.

7. The semiconductor device of claim 1, wherein an uppermost end of the spacer pattern is at a lower level than a lowermost end of the upper side unit of the source/drain region.

8. A semiconductor device comprising:
a substrate having a first fin active region pattern and a second fin active region pattern, each of which has a protruding shape;
a device isolation layer pattern covering a side surface of a lower portion of each of the first fin active region pattern and the second fin active region pattern;
a first source/drain region in contact with the first fin active region pattern, the first source/drain region including a first lower side unit and a first upper side unit on the first lower side unit; and
a second source/drain region in contact with a top surface of the second fin active region pattern, the second source/drain region including a second lower side unit and a second upper side unit on the second lower side unit,
wherein each of the first lower side unit and the second lower side unit has a constant lateral width or a lateral width reducing away from the substrate in a vertical direction, and the lateral width of the first lower side unit is greater than the lateral width of the second lower side unit,
the lateral width of at least one of the first lower side unit and the second lower side unit is greater than a lateral width of a corresponding portion of at least one of the first fin active region pattern and the second fin active region pattern protruding from the top surface of the device isolation layer pattern.

9. The semiconductor device of claim 8, further comprising:
a first spacer pattern covering a side surface of the portion of the first fin active region pattern protruding from the top surface of the device isolation layer pattern; and
a second spacer pattern covering a side surface of the portion of the second fin active region pattern protruding from the top surface of the device isolation layer pattern and a side surface of the second lower side unit.

10. The semiconductor device of claim 9, wherein an uppermost end of the first spacer pattern is at a higher level than an uppermost end of the second spacer pattern.

11. The semiconductor device of claim 9, further comprising an etch stop film covering the first source/drain region, the second source/drain region, the first spacer pattern, and the second spacer pattern,
wherein the etch stop film is in contact with a side surface of the first lower side unit.

12. The semiconductor device of claim 11, wherein the etch stop film is spaced apart from the second lower side unit with the second spacer pattern therebetween.

13. The semiconductor device of claim 8, wherein a height of the first lower side unit is greater than a height of the second lower side unit.

14. The semiconductor device of claim 8, wherein an uppermost end of the first source/drain region is at a higher level than an uppermost end of the second source/drain region.

15. A semiconductor device comprising:
a substrate having a first fin active region pattern and a second fin active region pattern formed in a first region and a second region, respectively, wherein the first fin active region pattern and the second fin active region pattern are doped with impurities of different conductivity types;
a device isolation layer pattern covering side surfaces of lower portions of the first fin active region pattern and the second fin active region pattern, respectively;
a spacer pattern covering a side surface of a portion of the first fin active region pattern protruding from a top surface of the device isolation layer pattern and a side surface of a portion of the second fin active region pattern;
a first source/drain region including a first lower side unit in contact with a top surface of the first fin active region pattern and a top surface of the spacer pattern and a first upper side unit on the first lower side unit; and
a second source/drain region including a second lower side unit in contact with a top surface of the second fin active region pattern and the top surface of the spacer pattern and a second upper side unit on the second lower side unit,
wherein each of the first lower side unit and the second lower side unit has a lateral width reducing away from the substrate in a vertical direction,
the lateral width of at least one of the first lower side unit and the second lower side unit is greater than a lateral width of a corresponding portion of at least one of the first fin active region pattern and the second fin active region pattern protruding from the top surface of the device isolation layer pattern.

16. The semiconductor device of claim 15, wherein the first upper side unit has a polyhedral shape having facets, and
at least a portion of a surface of the second upper side unit has a round shape.

17. The semiconductor device of claim 15, further comprising an etch stop film covering the first source/drain region, the second source/drain region, and the spacer pattern,
wherein the etch stop film is in contact with each of a side surface of the first lower side unit and a side surface of the second lower side unit.

18. The semiconductor device of claim 17, wherein the etch stop film is spaced apart from each of the first fin active region pattern and the second fin active region pattern with the spacer pattern therebetween, and
an uppermost end of the spacer pattern is at a lower level than each of a lowermost end of the first upper side unit and a lowermost end of the second upper side unit.

* * * * *